United States Patent
Kirkpatrick et al.

(10) Patent No.: US 9,444,501 B1
(45) Date of Patent: Sep. 13, 2016

(54) POLAR MODULATION USING PRODUCT MODE

(71) Applicant: Eridan Communications, Inc., San Francisco, CA (US)

(72) Inventors: Douglas A. Kirkpatrick, San Francisco, CA (US); Earl W. McCune, Jr., Santa Clara, CA (US)

(73) Assignee: Eridan Communications, Inc., San Francisco, CA (US)

( * ) Notice: Subject to any disclaimer, the term of this patent is extended or adjusted under 35 U.S.C. 154(b) by 0 days.

(21) Appl. No.: 15/182,549

(22) Filed: Jun. 14, 2016

Related U.S. Application Data

(63) Continuation of application No. 14/958,418, filed on Dec. 3, 2015, now Pat. No. 9,397,713.

(51) Int. Cl.
  *H04B 1/04* (2006.01)
  *H03F 1/02* (2006.01)
  *H03F 3/193* (2006.01)
  *H03F 3/21* (2006.01)

(52) U.S. Cl.
  CPC .......... *H04B 1/0475* (2013.01); *H03F 1/0205* (2013.01); *H03F 3/193* (2013.01); *H03F 3/21* (2013.01); *H03F 2200/102* (2013.01); *H03F 2200/451* (2013.01); *H03F 2201/3215* (2013.01); *H04B 2001/045* (2013.01); *H04B 2001/0408* (2013.01)

(58) Field of Classification Search
  CPC .......... H04B 1/0475; H04B 2001/045; H04B 2001/0408; H03F 1/0205; H03F 3/193; H03F 3/21; H03F 2200/102; H03F 2200/451; H03F 1/0211; H03G 3/004; H03G 3/3042
  See application file for complete search history.

(56) References Cited

U.S. PATENT DOCUMENTS

| | | | | |
|---|---|---|---|---|
| 7,010,276 B2* | 3/2006 | Sander | .................. | H03F 1/0211 330/10 |
| 8,050,638 B2* | 11/2011 | Vinayak | ................ | H03F 1/0222 330/136 |
| 2004/0263245 A1* | 12/2004 | Winter | ................... | H03F 1/0222 330/10 |
| 2010/0069025 A1* | 3/2010 | Takinami | .............. | H03F 1/0222 455/127.3 |
| 2010/0178886 A1* | 7/2010 | Pennec | ................ | H04B 1/3822 455/127.1 |

\* cited by examiner

*Primary Examiner* — Freshteh N Aghdam
(74) *Attorney, Agent, or Firm* — Patent Law Professionals, P.C.; William E. Winters

(57) ABSTRACT

Radio frequency (RF) transmitters and methods of their operation are disclosed. An exemplary RF transmitter includes an RF power amplifier (RFPA), a dynamic power supply (DPS), and a baseband processing unit. The baseband processing unit generates an amplitude modulation (AM) signal that the DPS follows to generate a DPS voltage $V_{DD}(t)$. The DPS voltage $V_{DD}(t)$ serves as a power supply for an output stage of the RFPA. Under most operating conditions the output stage is configured to operate in a compressed mode (C-mode), but is reconfigured to operate in a product mode (or "P-mode) during times low-magnitude events in the AM signal are conveyed to the DPS and become present in the DPS voltage $V_{DD}(t)$ produced by the DPS. Operating the output stage in P-mode overcomes the inability of C-mode operation to reproduce low-magnitude events contained in the AM signal at the RF output of the RFPA.

15 Claims, 20 Drawing Sheets

US 9,444,501 B1

POLAR MODULATION USING PRODUCT MODE

CROSS-REFERENCE TO RELATED APPLICATIONS

This application is a continuation of U.S. patent application Ser. No. 14/958,418, filed on Dec. 3, 2015, the disclosure of which is incorporated herein by reference.

STATEMENT REGARDING FEDERALLY SPONSORED RESEARCH OR DEVELOPMENT

This invention was made with Government support under Contract No. FA8750-14-C-0099 awarded by the Air Force Research Laboratory on behalf of DARPA. The Government has certain rights in the invention.

BACKGROUND OF THE INVENTION

One of the principal functions of a radio frequency (RF) transmitter is to translate its modulated RF carrier to higher RF power, so that the modulated RF carrier can then be radiated over the air and successfully received by a remote receiver. Converting the RF carrier to higher RF power is the responsibility of the RF transmitter's power amplifier (PA). Because the PA is typically the component in the RF transmitter that consumes the most energy, one of the primary goals typically involved in the design of an RF transmitter is making the PA operate as efficiently as possible.

Designing a PA that can operate with high efficiency presents a difficult challenge. Many modern communications systems employ complex modulation schemes in which both the magnitude and the angle (i.e., phase or frequency) of an RF carrier are modulated to convey information. By modulating both the magnitude and angle of the RF carrier, rather than just the magnitude or just the angle of the RF carrier, the RF spectrum can be used more efficiently. Unfortunately, designing a PA that is capable of converting the resulting non-constant envelope RF carrier to higher power with high efficiency is difficult, particularly when the non-constant envelope RF carrier has a high peak-to-average ratio (PAR).

One well-known and increasingly utilized approach to achieving high PA efficiency is to employ a type of RF transmitter known as a polar modulation transmitter. FIG. 1 is a simplified drawing of a polar modulation transmitter 100. The polar modulation transmitter 100 comprises a baseband processor 102, a dynamic power supply (DPS) 104, a phase modulator 106, and a switch-mode PA (SMPA) 108. The baseband processor 102 serves to generate polar-domain amplitude modulation (AM) and phase modulation (PM) signals. The AM signal is applied to the DPS 104, which responds by generating a time-varying DPS voltage $V_{DD}(t)$ that tracks the AM contained in the AM signal. Meanwhile, the phase modulator 106 modulates an RF carrier by the PM contained in the PM signal, producing a constant-envelope phase-modulated RF carrier, which is used to drive the RF input of the SMPA 108. The magnitude of the constant-envelope phase-modulated RF carrier is purposely set high so that the SMPA 108 is overdriven and operates as a switch. As the constant-envelope phase-modulated RF carrier switches the SMPA 108 ON and OFF in accordance with the PM, the DPS voltage $V_{DD}(t)$ produced by the DPS 104 is supplied to the power supply port of the SMPA 108, which typically comprises a power field-effect transistor (FET) having a drain that serves as the power supply port. One important property of an SMPA is that the RF output power that it produces depends on the magnitude of its power supply voltage, or, more specifically, on the square of the magnitude of its power supply voltage. This dependency is exploited in the polar modulation transmitter 100 to superimpose (i.e., modulate) the AM contained in the DPS voltage $V_{DD}(t)$ onto the RF output of the SMPA 108 as the SMPA 108 converts the constant-envelope phase-modulated RF carrier to higher RF power. This act of introducing the AM through the drain supply of the SMPA 108 is known as "drain modulation," and is a capability that avoids having to apply the AM through the RF path of the SMPA 108. Instead, only the constant-envelope phase-modulated RF carrier needs to be applied through the RF path of the SMPA 108.

The ability of the SMPA 108 to operate as a switch and its ability to perform drain modulation make the polar modulation transmitter 100 substantially more energy efficient than a conventional RF transmitter. The conventional RF transmitter employs a linear PA (such as a Class A, AB, or B linear PA), which operates as a controlled current source—not as a switch—and produces RF output power that is independent of, and incapable of being modulated by, its power supply voltage. Consequently, drain modulation cannot be performed in a linear PA and in order for the linear PA to produce a non-constant envelope RF carrier at its output the AM must be passed through the RF input port of the linear PA. Passing the AM through the RF input port of the linear PA requires that RF output power of the linear PA be backed off, such that output signal peaks remain below the linear PA's saturated output power, in order to prevent distortion. This back off requirement, together with the fact that the linear PA operates as a current source and not as a switch results in the conventional linear-PA-based RF transmitter being significantly less efficient compared to a polar modulation transmitter. Therefore, when efficiency is a primary concern, and especially when non-constant envelope signals are involved, the polar modulation transmitter is the better option.

Although the polar modulation transmitter 100 operates with high efficiency, one significant problem that follows from its use is that it can be difficult to reduce the signal envelope of its non-constant envelope RF output to zero or near zero during times when it should. Various wireless communications standards such as, for example, Wideband Code Division Multiple Access (W-CDMA) and Long-Term Evolution (LTE), employ complex modulation schemes in which the magnitude of the signal envelope of an RF carrier must, on certain occasions, be reduced to zero or very near zero. FIGS. 2 and 3 show, for example, waveform snippets of typical signal envelope waveforms observed in communications systems operating in accordance with the W-CDMA air interface (FIG. 2) and the LTE interface (FIG. 3). The waveform snippet in FIG. 2 reveals that although low-magnitude events are rare in the AM in W-CDMA-based communications, as indicated by the circled low-magnitude event 202, they nevertheless occur. The waveform snippet in FIG. 3 shows that low-magnitude events also occur in the AM in LTE-based communications, and tend to occur more frequently. The polar modulation transmitter 100 has difficulty reproducing these low-magnitude events in the signal envelope at the RF output of the RFPA 614 for two primary reasons. First, the output stage power transistor of the SMPA 108, which is typically a FET, has a gate-to-drain capacitor $C_{gd}$ that provides a parasitic leakage path through which the constant-envelope phase-modulated RF carrier, which, as explained above serves as the RF switch drive signal for the SMPA 108, can leak to the output of the SMPA 108. FIG. 4 is a plot of the RF output power of a typical SMPA showing this leakage effect. The RF output power of the SMPA is plotted in decibels (relative to the average output power of the SMPA (i.e., dBr)) as a function of the normalized DPS output voltage. Ideally, the RF output power of the SMPA is proportional to the square of the magnitude of the DPS voltage $V_{DD}(t)$, and for all magnitudes of $V_{DD}(t)$. This ideal characteristic is shown in FIG. 4 by the "square law" straight line. At higher magnitudes of $V_{DD}(t)$, for example when the normalized DPS voltage in the plot is greater than 0.1, leakage is not seen to be a major concern. However, at lower magnitudes of $V_{DD}(t)$, for example when the normalized DPS voltage drops below 0.01, the leaked RF switch drive signal begins to dominate the RF output of the SMPA and prevents the magnitude of the signal envelope of the RF output from dropping down to lower magnitudes, as it should.

A second reason it can be difficult for the polar modulation transmitter 100 to reduce the magnitude of the signal envelope of its RF output to zero or near zero when the intended AM dictates that is should relates to bandwidth handling limitations of the DPS 104. As can be seen in FIGS. 2 and 3, the signal envelopes in state-of-the-art communications signals tend to inflect very sharply during occurrences of low-magnitude events. In some cases the bandwidth handling capability of the DPS 104 will be insufficient for the DPS 104 to accurately track these sharply inflecting low-magnitude events. Consequently, rather that the DPS 104 producing a DPS voltage $V_{DD}(t)$ like the desired DPS voltage depicted in FIG. 5A, the DPS 104 produces a DPS voltage that more resembles the DPS voltage depicted in FIG. 5B. The inability of the DPS 104 to reproduce low-magnitude events contained in the original AM at its output thus results in the SMPA 108 also producing an RF output with a signal envelope that does not reduce to zero or near zero when it should.

The inability of the polar modulation transmitter 100 to faithfully produce low-magnitude events at its output is undesirable, whether the inability is attributable to leakage of the phase-modulated RF switch drive signal through the leakage path of the output stage power transistor the SMPA 108, is attributable to bandwidth handling limitations of the DPS 104, or is attributable to a combination of both problems. The inability to faithfully produce the low-magnitude events can lead to errors at the receiving end of the communications system, and can make it difficult, and sometimes even impossible, to comply with signal accuracy requirements (for example, maximum permissible error vector magnitude (EVM)) set forth in the controlling communications standard. The present invention addresses and provides solutions to these problems.

BRIEF SUMMARY OF THE INVENTION

Radio frequency (RF) transmitters and methods of their operation are disclosed. An exemplary RF transmitter includes an RF power amplifier (RFPA), a dynamic power supply (DPS), and a baseband processing unit. The baseband processing unit generates an amplitude modulation (AM) signal that the DPS follows to generate a DPS voltage $V_{DD}(t)$. The DPS voltage $V_{DD}(t)$ serves as a power supply for an output stage of the RFPA. Under most operating conditions the output stage is configured to operate in a compressed mode (C-mode), but is reconfigured to operate in a product mode (or "P-mode") during times low-magnitude events in the AM signal are conveyed to the DPS and become present in the DPS voltage $V_{DD}(t)$ produced by the DPS. Operating the output stage in P-mode overcomes the inability of C-mode operation to reproduce low-magnitude events contained in the AM signal at the RF output of the RFPA.

Further features and advantages of the invention, including a detailed description of the above-summarized and other exemplary embodiments of the invention, will now be described in detail with respect to the accompanying drawings, in which like reference numbers are used to indicate identical or functionally similar elements.

DETAILED DESCRIPTION

Figure 6:
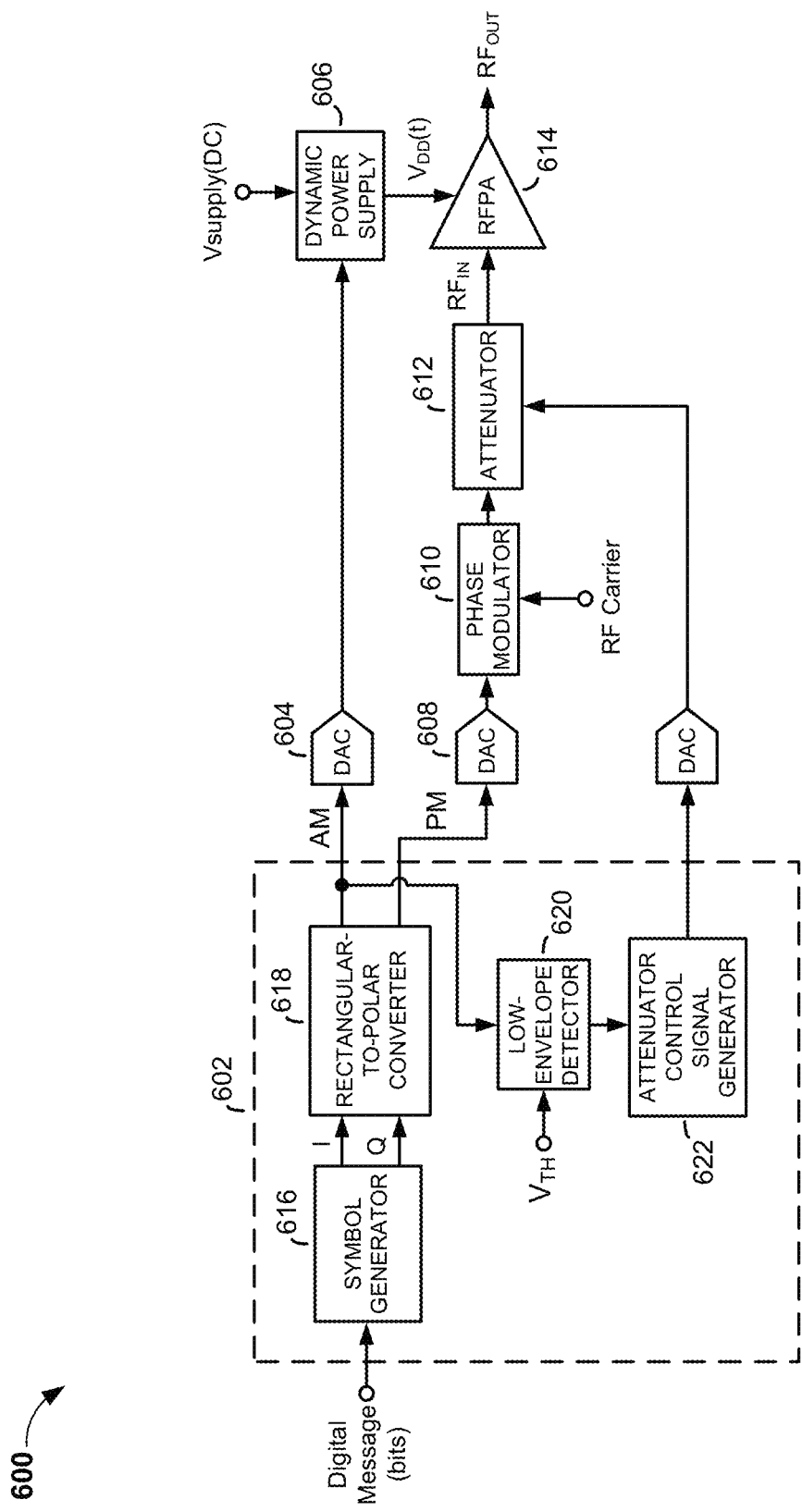
FIG. 6 is a drawing depicting an RF transmitter, according to one embodiment of the present invention.

Referring to FIG. 6, there is shown a drawing of a radio frequency (RF) transmitter 600, according to one embodiment of the present invention. The RF transmitter 600 comprises a baseband processing unit 602; an amplitude modulation (AM) path that includes an AM-path digital-to-analog converter (DAC) 604 and dynamic power supply (DPS) 606; a phase modulation (PM) path that includes a PM-path DAC 608, a phase modulator 610 and attenuator 612; and a radio frequency power amplifier (RFPA) 614. In one embodiment of the invention, the baseband processing unit 602 comprises an all-digital baseband processing unit implemented in a field programmable gate array (FPGA) or other similar device. In another embodiment of the invention the baseband processing unit 602 is implemented using a combination of hardware and software and comprises a digital signal processor, system-on-a-chip, microcontroller, microprocessor, or some combination or variation of these or other similar hardware and software elements. It should be mentioned that whereas the baseband processing unit 602 is preferably an all-digital design, it may be alternatively constructed using analog components or a combination of digital and analog components. Furthermore, whereas the phase modulator 610 and DPS 606 are shown and described in this exemplary embodiment of the invention as being purely analog components, either or both of these components could be alternatively constructed using a combination of digital and analog circuits and devices. For example, the phase modulator 610 could be implemented using a digital delay-locked loop or a direct digital synthesizer, and the DPS 606 could be implemented as a digitally controlled Class-S modulator. Various examples as to how the phase modulator 610 can be implemented are described in E. McCune, "Practical Digital Wireless Signals," Cambridge University Press, (2010), which is incorporated herein by reference. Various examples as to how the DPS 606 may be implemented can be found in E. McCune, "Dynamic Power Supply Transmitters," Cambridge University Press, (2015), which is also incorporated herein by reference.

As shown in FIG. 6, the baseband processing unit 602 includes a symbol generator 616, a rectangular-to-polar converter 618, a low-envelope detector 620, and an attenuator control signal generator 622. The symbol generator 616 serves to generate in-phase (I) and quadrature (Q) symbols from digital a message to be transmitted. The rectangular-to-polar converter 618 converts the I and Q symbols into digital AM and PM components, which are then directed into the AM and PM paths of the RF transmitter 600. The significance and purpose of the low-envelope detector 620 and the attenuator control signal generator 622 will be described in detail below.

During normal operating conditions when the magnitude of the AM is high, the RF transmitter 600 is configured to operate similar to a conventional polar modulation transmitter, such that the output stage of the RFPA 614 operates as a switch (i.e., as a switch-mode PA (SMPA)). Additionally, the attenuator 612 is not used or is otherwise disabled. The constant-envelope phase-modulated RF carrier produced by the phase modulator 610 is therefore at full drive level and, as discussed in more detail below, the resulting RF drive signal applied to the output stage of the RFPA 614 (referred to as the "RF switch drive signal" below) is also at full drive level. Similar to as in a conventional polar modulation transmitter, the RF switch drive signal drives the output stage of the RFPA 614 hard, between compressed (ON) and cut-off (OFF) states, in accordance with the PM contained in the RF switch drive signal. This switch-mode operation of the output stage of the RFPA 614 is referred to in this disclosure as "compressed mode" or "C-mode" operation.

Figure 7:
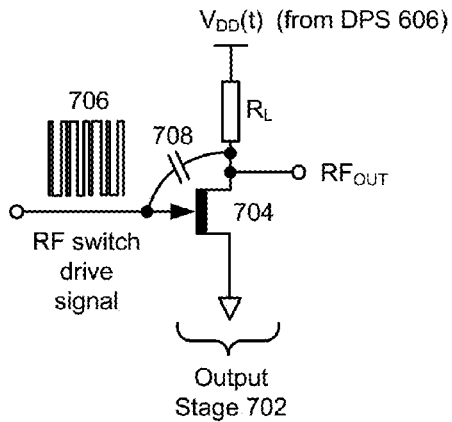
FIG. 7 is a schematic drawing of the output stage of the RF power amplifier (RFPA) of the RF transmitter depicted in FIG. 6 during times when the output stage of the RFPA is configured for compressed mode (C-mode) operation.

FIG. 7 is a drawing illustrating how the output stage 702 of the RFPA 614 is configured and controlled during C-mode operation. The output stage 702 includes a power transistor 704, which in one embodiment of the invention comprises a depletion mode field-effect transistor (FET), such as a gallium nitride (GaN) high electron mobility transistor (GaN-HEMT) or a gallium arsenide (GaAs) metal-semiconductor FET (GaAs-MESFET). Accordingly, the conventional symbol for depicting a depletion mode FET is used in the drawing in FIG. 7. Similar to as in a conventional polar modulation transmitter, the RF switch drive signal 706 switches the output stage transistor 704 ON and OFF as drain modulation is performed by the output stage 702, thereby superimposing the AM contained in the DPS voltage $V_{DD}(t)$ onto the RF output $RF_{OUT}$.

Figure 8:
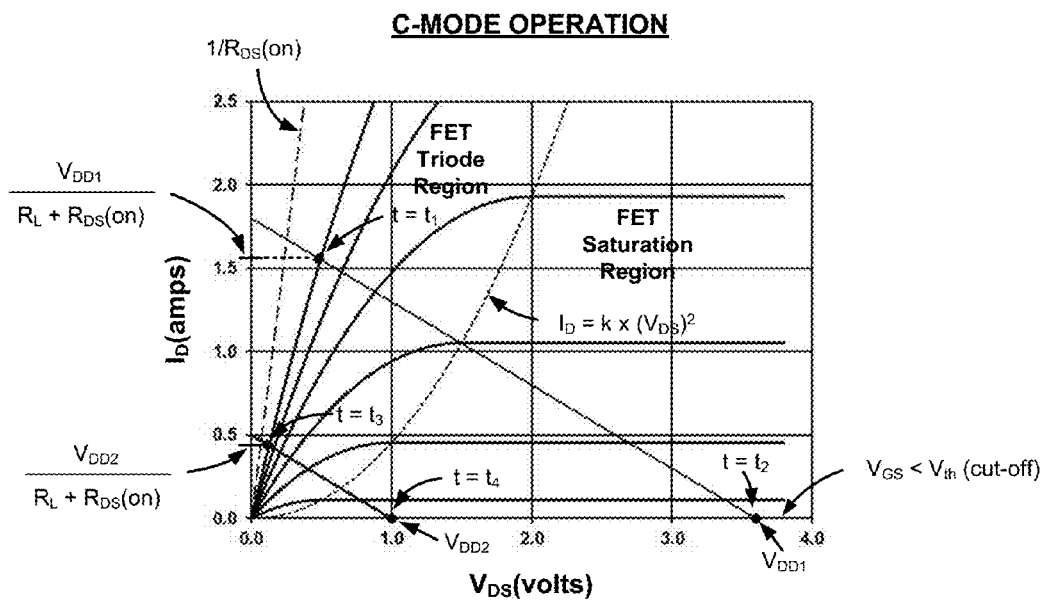
FIG. 8 is plot of the drain current $I_D$ versus drain-source voltage $V_{DS}$ characteristic curves of the output stage of the RFPA of the RF transmitter depicted in FIG. 6, illustrating how the output stage operates when configured for C-mode operation how drain modulation is performed by the output stage.

FIG. 8 is plot of the drain current $I_D$ versus drain-source voltage $V_{DS}$ characteristic curves of the output stage 702 of the RFPA 614, further illustrating how the output stage 702 operates when configured for C-mode operation, and further illustrating how drain modulation is performed by the output stage 702. C-mode operation is shown for two different DPS voltages, $V_{DD1}$ and $V_{DD2}$. During a first time period $t_1 < t < t_2$, the DPS 606 (see FIG. 6) is supplying the DPS voltage $V_{DD1}$. At time $t = t_1$, the RF switch drive signal 706 (see FIG. 7) is at its high-magnitude level, thus causing the output stage power transistor 704 to compress and switch ON. Subsequently, at $t = t_2$, the RF switch drive signal 706 drops to its low-magnitude level (which is lower than the threshold voltage $V_{th}$ of the output stage power transistor 704), causing the output stage transistor 704 to enter the cut-off region of the $I_D$ versus $V_{DS}$ characteristic curves and switch OFF. Note that the line joining the $t=t_1$ (ON) and $t=t_2$ (OFF) states in the $I_D$ versus $V_{DS}$ characteristic curves is the load line for C-mode operation. In C-mode operation the output stage 702 does not operate along the load line in the same manner that a conventional linear PA operates along a load line. Rather, the output stage 702 is switched very rapidly between compressed (ON) and cut-off (OFF) states and spends negligible time (only during the very brief transitions between ON and OFF states) along the load line in the saturation region of the $I_D$ versus $V_{DS}$ characteristic curves. Subsequent to the first time period $t_1<t<t_2$ and during a second time period $t_3<t<t_4$ the DPS 606 is supplying a DPS voltage $V_{DD2}$, where $V_{DD2}<V_{DD1}$. At time $t=t_3$, the RF switch drive signal 706 is at its high-magnitude level, which causes the output stage power transistor 704 to once again compress and switch ON. Finally, at time $t=t_4$, the switch drive signal 706 transitions to its low-magnitude level, causing the output stage power transistor 704 to enter the cut-off region and switch OFF. Since when operating in C-mode the RF output power produced by the output stage 702 of the RFPA 614 is dependent upon the square of the magnitude of the DPS voltage $V_{DD}(t)$ being applied to the output stage 702, the RF output power produced by the RFPA 614 during the second time period $t_3<t<t_4$ is lower than the RF output power produced by the RFPA 614 during the first time period $t_1<t<t_2$. The change from high RF output power during the time period $t_1<t<t_2$ (when the DPS voltage $V_{DD}=V_{DD1}$) to lower RF output power during the time period $t_3<t<t_4$ (when the DPS voltage $V_{DD}=V_{DD1}<V_{DD2}$) thus illustrates the drain modulation property of the output stage 702 when the output stage 702 is configured for C-mode operation.

Figure 1:
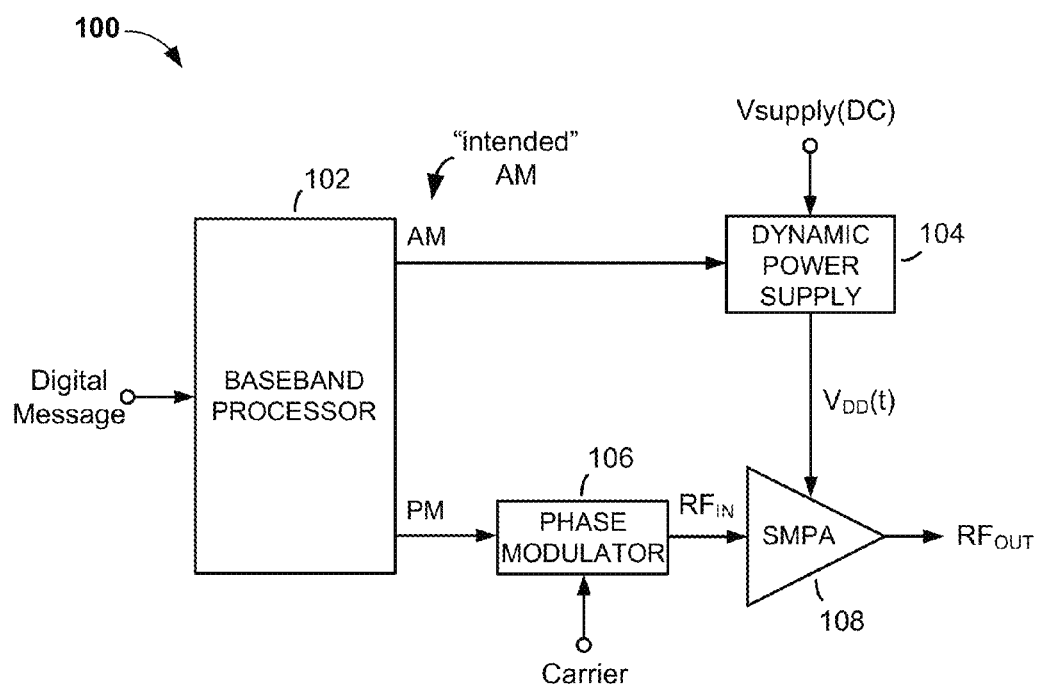
FIG. 1 is a simplified drawing of a conventional polar modulation transmitter.
Figure 2:
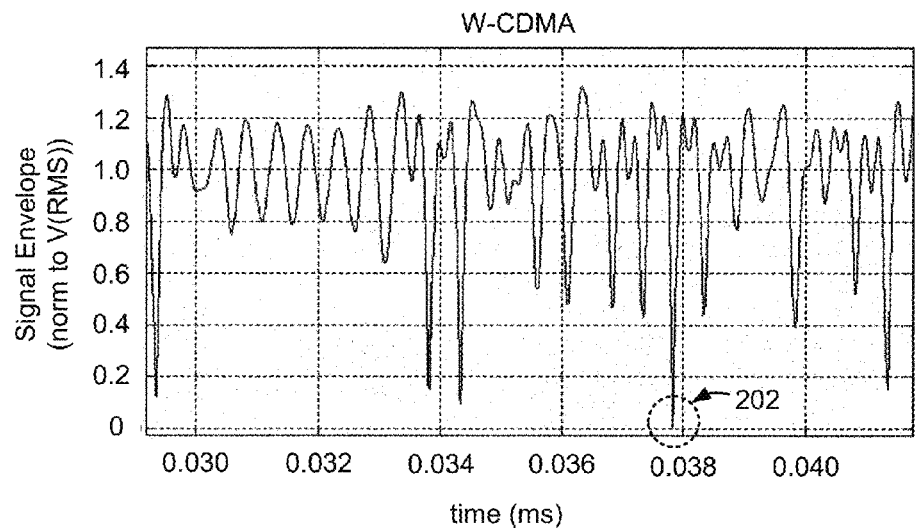
FIGS. 2 and 3 are waveform snippets of typical signal envelope waveforms observed in communications systems operating in accordance with the Wideband Code Division Multiple Access (W-CDMA) air interface and Long-Term Evolution (LTE) interface, respectively.
Figure 3:
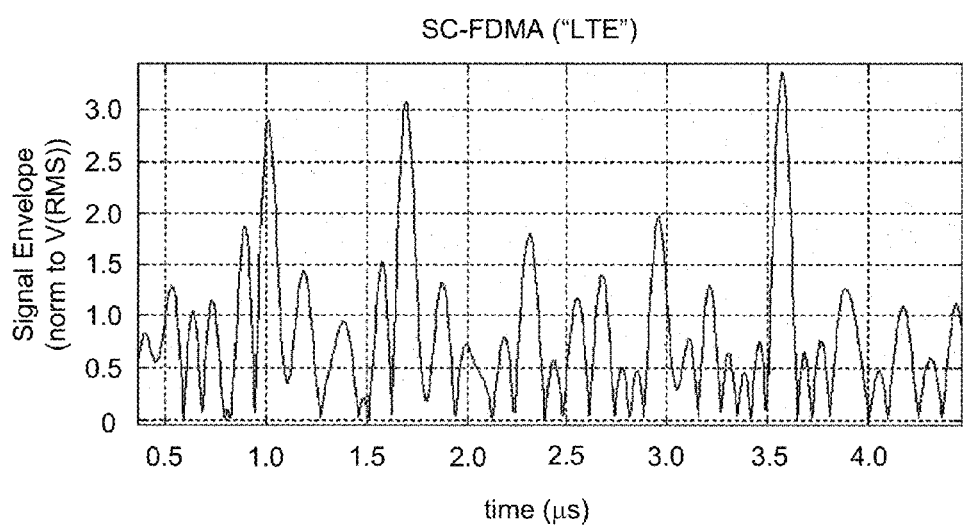
Figure 4:
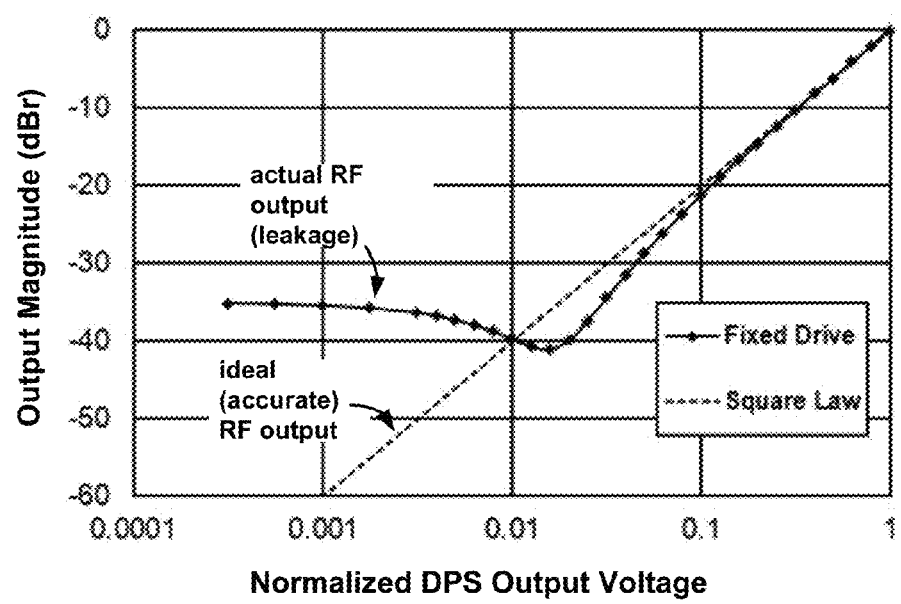
FIG. 4 is a plot of the radio frequency (RF) output power produced by a typical switch-mode power amplifier (SMPA) as a function of the normalized dynamic power supply (DPS) voltage supplied to the SMPA, highlighting the leakage effect that can be observed in an SMPA at lower values of the DPS voltage.
Figure 5A:
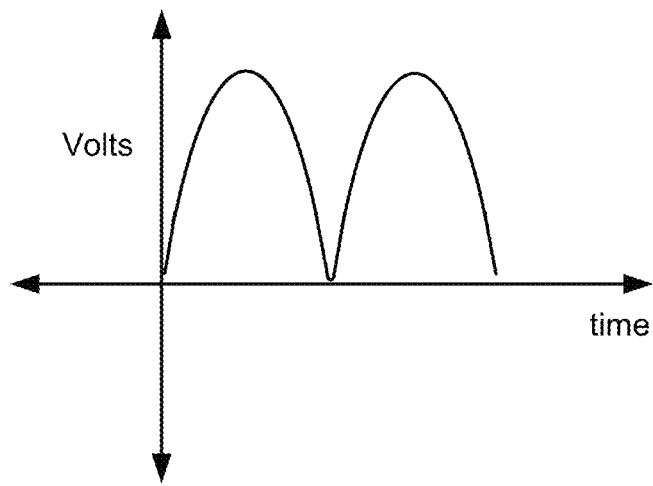
FIGS. 5A and 5B are simplified voltage versus time drawings of the desired (i.e., ideal) DPS voltage produced by a DPS (FIG. 5A) and the actual DPS voltage produced by a practical bandwidth-limited DPS (FIG. 5B), highlighting how the practical bandwidth-limited DPS is unable to properly reproduce a low-magnitude event at its output.
Figure 5B:
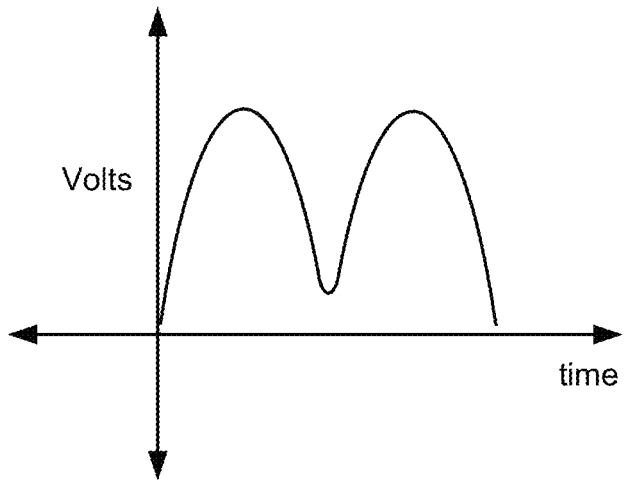

When the output stage 702 of the RFPA 614 is operating in C-mode and the DPS voltage $V_{DD}(t)$ remains at a relatively high magnitude, the AM produced by the baseband processing unit 602 (i.e., the "original" or "intended" AM) is faithfully reproduced in the signal envelope of the RF output $RF_{OUT}$ of the RFPA 614. However, at lower magnitudes of the DPS voltage $V_{DD}(t)$ leakage of the RF switch drive signal 706 through the parasitic gate-drain leakage path 708 (see FIG. 7) can begin to have a significant effect on or even dominate the RF output $RF_{OUT}$ of the RFPA 614 and prevent the magnitude of the RF output of the RFPA 614 from reducing to zero or near zero during times that the original AM dictates that it should. Bandwidth handling limitations of the DPS 606 can also result in a DPS voltage $V_{DD}(t)$ that does not accurately track low-magnitude events in the original AM. As was explained above in reference to FIGS. 2 and 3, the signal envelopes in state-of-the-art communications signals tend to inflect very sharply during occurrences of low-magnitude events. These sharply inflecting low-magnitude events can be very difficult, and in some cases practically impossible, to reproduce in the DPS voltage $V_{DD}(t)$. Consequently, because in C-mode the RF output of the RFPA 614 is controlled based on the magnitude of the DPS voltage $V_{DD}(t)$, any inability of the DPS 606 at being capable of reproducing low-magnitude events in its output due to sharply inflecting low-magnitude events can result in the RF output of the RFPA 614 also not reducing to zero or near zero when it should.

Figure 9:
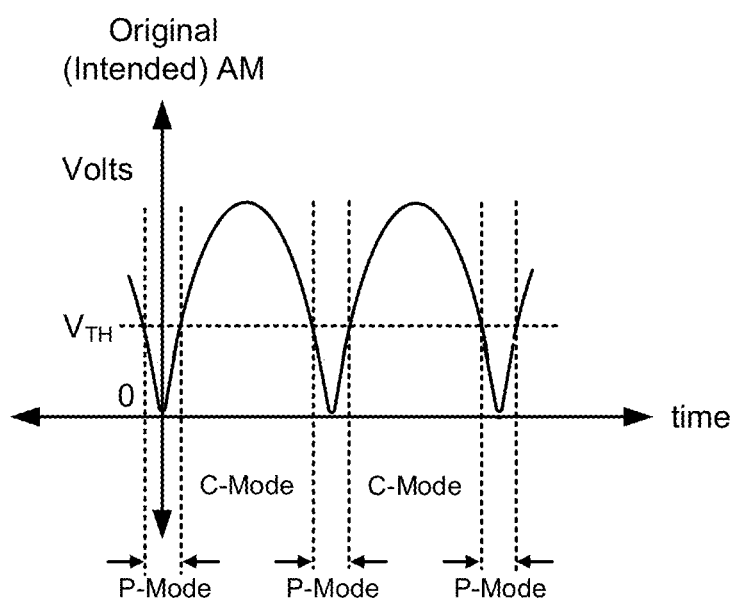
FIG. 9 is a simplified voltage versus time drawing of the original (i.e., intended) amplitude modulation (AM) signal produced by the baseband processing unit of the RF transmitter depicted in FIG. 6, highlighting the low-envelope threshold voltage $V_{TH}$ used by the low-envelope detector in the baseband processing unit and the times during which the output stage of the RFPA of the RF transmitter operates in C-mode and product mode (P-mode)

The inability of C-mode operation to reduce the signal envelope of the RF output of the RFPA 614 to zero or near zero when the original AM produced by the baseband processing unit 602 (see FIG. 6) dictates that it should, whether the inability is caused by the C-mode RF switch drive signal 706 leaking through the leakage path 708 of the output stage power transistor 704 or is attributable to bandwidth handling limitations of the DPS 606, is overcome in the present invention by configuring the output stage 702 of the RFPA 614 to operate in what is referred as "product mode" or "P-mode" during times low-magnitude events contained in the original AM become present in the DPS voltage $V_{DD}(t)$. As the baseband processing unit 602 generates the AM and PM components for the AM and PM paths of the transmitter, the low-envelope detector 620 monitors or analyzes the original AM to detect when it drops below some predetermined low-envelope voltage threshold $V_{TH}$. The value of the low-envelope voltage threshold $V_{TH}$ is determined and set during design, taking into consideration the leakage characteristics of the RFPA 614, behavioral characteristics of the DPS 606 (such as its bandwidth handling capability), temporal characteristics of the particular modulation scheme being used, signal accuracy requirements specified in the objective communications standard, and/or possibly on other or similarly related factors. As illustrated in FIG. 9, when the magnitude of the original AM is above the low-envelope voltage threshold $V_{TH}$, the output stage 702 remains operating in C-mode. However, upon the low-envelope detector 620 detecting that the original AM has dropped below the low-envelope threshold voltage $V_{TH}$ (indicative of a low-magnitude event in the original AM), the low-envelope detector 620 directs the attenuator control signal generator 622 to generate an attenuator control signal for the attenuator 612 (see FIG. 6). This causes the attenuator 612 to attenuate the phase-modulated RF signal produced by the phase modulator 610 and, consequently, lower the magnitude of the RF drive signal being applied to the output stage 702 of the RFPA 614 so that the output stage 702 is no longer capable of being operated as a switch (i.e., so that it no longer operates in C-mode). Instead, with the RF drive signal attenuated, the output stage 702 commences operating in P-mode during the time that the low-magnitude contained in the original AM event becomes present in the DPS voltage $V_{DD}(t)$. As indicated in FIG. 9, the output stage 702 continues operating in P-mode only for the duration of the low-magnitude event. Operating the output stage 702 in P-mode is less efficient than operating it in C-mode. However, the energy loss is negligible since P-mode operation is only used at low RF output power levels and because the low-magnitude events are typically short in duration. Once a low-magnitude event has passed through the RFPA 614, the attenuator 612 is disabled and high-efficiency C-mode operation resumes.

Figure 10:
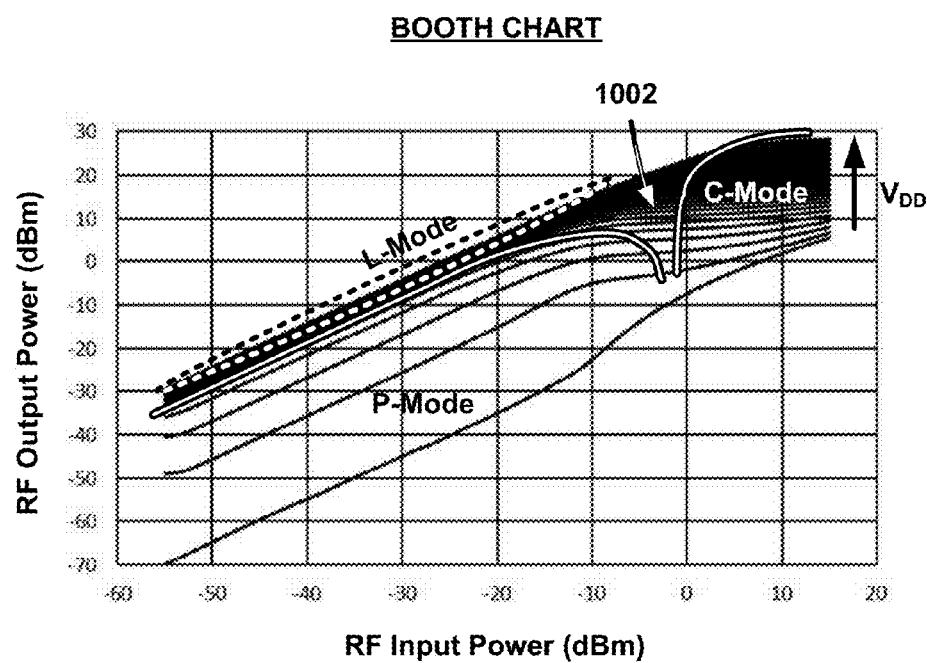
FIG. 10 is a Booth chart illustrating how the RF output power produced by an RFPA is influenced, if at all, by variations in the magnitude of the drain supply voltage $V_{DD}$ being applied to the drain of the output stage power transistor of the RFPA and how the RF output power produced by the RFPA is influenced by, if at all, variations in the RF input power applied to the RFPA when the output stage of the RFPA is configured for operation in three different operating modes—linear mode (i.e., "L-mode"), P-mode, and C-mode.

To illustrate how configuring the output stage 702 of the RFPA 614 in P-mode overcomes the inability of C-mode to reproduce low-magnitude events in the signal envelope of the RF output of the RFPA 614, reference is made to the Booth chart in FIG. 10. The Booth chart reveals how the RF output power produced by the RFPA 614 is influenced, if at all, by variations in the magnitude of the drain supply voltage $V_{DD}$ being applied to the drain of the output stage power transistor 704 of the RFPA 614 and how the RF output power produce by the RFPA 614 is influenced by, if at all, variations in the RF input power applied to the RFPA 614, when the output stage 702 of the RFPA 614 is configured for operation in three different operating modes—linear mode (i.e., "L-mode"), P-mode, and C-mode. Each curve in the Booth chart represents a different and particular drain power supply voltage $V_{DD}$. When the output stage 702 of the RFPA 614 is configured to operate in C-mode, the RF output power produced by the RFPA 614 is seen to be sensitive to variations in the drain supply voltage $V_{DD}$ being applied to the output stage 702 but not to variations in the RF input power being applied to the RF input of the output stage 702, as expected. In contrast, when the output stage 702 of the RFPA 614 is configured to operate in linear mode ("L-mode"), which is representative of a linear RFPA (such as a Class-A, B, or AB linear RFPA), the RF output power is seen to be sensitive to variations in the RF input power applied to the RFPA 614 but not to variations in the power supply voltage $V_{DD}$ being applied to the output stage 702 of the RFPA 614. This is also as expected since a linear RFPA operates as a current source—not as a switch—and is largely unaffected by any variation in the drain supply voltage $V_{DD}$. Finally, when the output stage 702 of the RFPA 614 is configured to operate in P-mode, it is seen that the RF output power produced by the RFPA 614 is sensitive to both variations in the magnitude of the power supply voltage $V_{DD}$ being applied to the output stage 702 and variations in the RF input power being applied to the RF input of the output stage 702. In fact, it can be shown that when the output stage 702 of the RFPA 614 is configured for P-mode operation, the RF output power produced by the RFPA 614 is proportional to the product of the magnitude of the DPS voltage $V_{DD}$ and the magnitude of the gate drive signal $V_{GS}$, hence the name "product mode." In other words, when in P-mode, $P_{out} \alpha V_{DD} \times V_{GS}$.

The key to understanding how configuring the output stage 702 of the RFPA 614 to operate in P-mode overcomes the inability of C-mode operation to reduce the signal envelope of the RF output $RF_{OUT}$ to zero or near zero when the original AM dictates that it should is to observe that the leakage of the RF drive signal through the output stage parasitic gate-drain leakage path 708 (see FIG. 7) occurs, and is most problematic, when the RF drive signal is of a high magnitude, such as when in C-mode. In C-mode operation the RF drive signal 706 must have a high magnitude, in order to force the output stage power transistor 704 to operate as a switch. This high-magnitude switch drive signal 706 can leak through the parasitic gate-drain leakage path 708, regardless of the magnitude of the DPS voltage $V_{DD}(t)$, even if the magnitude of the DPS voltage $V_{DD}(t)$ is reduced to zero. When the DPS voltage $V_{DD}(t)$ also has a high magnitude, leakage of the RF switch drive signal 706 is not a major concern since the DPS output voltage $V_{DD}(t)$ dominates the RF output $RF_{OUT}$ of the RFPA 614, thus rendering the leakage of the RF switch drive signal 706 of less significance. However, when the DPS voltage $V_{DD}(t)$ has a low magnitude, the leaked RF switch drive signal can dominate the RF output of the RFPA 614 and prevent the signal envelope of the RF output from reducing to zero or near zero during times that it should. When the output stage 702 of the RFPA 614 is configured for P-mode operation, however, the Booth chart in FIG. 10 reveals that the output stage 702 is responsive not only to variations in the DPS voltage $V_{DD}(t)$ but also to variations in the magnitude of the gate drive voltage $V_{GS}(t)$. Accordingly, by attenuating the gate drive voltage $V_{GS}(t)$ to a low-magnitude suitable for P-mode operation when the original AM produced by the baseband processing unit 602 dictates that the signal envelope of the RF output should be reduced to zero or near zero, leakage through the parasitic gate-drain leakage path 708 is substantially eliminated.

Figure 11:
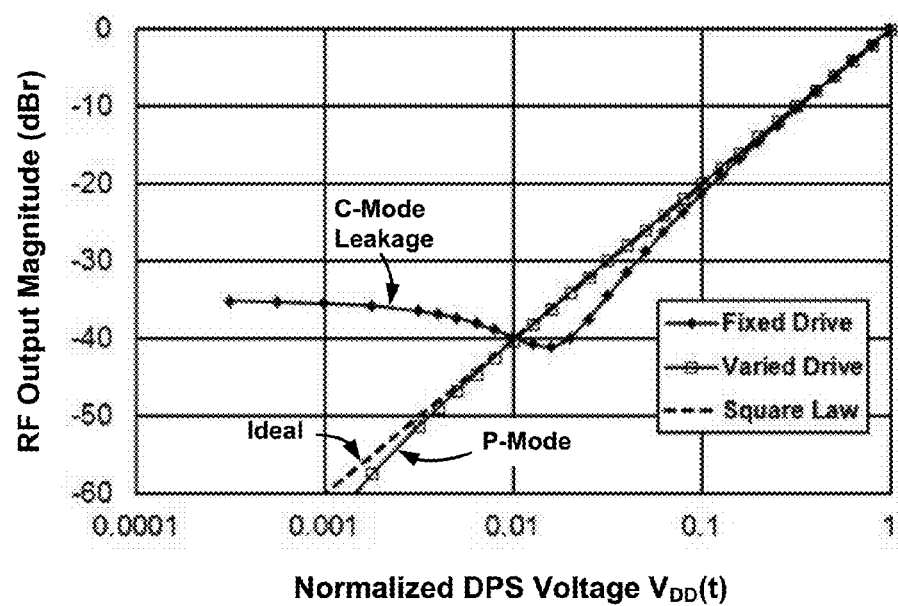
FIG. 11 is a plot of the RF output power of the RFPA of the RF transmitter depicted in FIG. 6 when the output stage of the RFPA is operating in C-mode compared to when operating in P-mode, highlighting how operating the output stage of the RFPA in P-mode serves to overcome the leakage problem that can occur when operating the output stage in C-mode.

FIG. 11 is a plot of the RF output power of the RFPA 614 of the RF transmitter 600 when the output stage 702 of the RFPA 614 is operating in C-mode compared to when operating in P-mode. The plot highlights the ability of P-mode operation to overcome the leakage problem that can occur when operating in C-mode. When the output stage 702 is operating in C-mode and at lower magnitudes of the DPS voltage $V_{DD}(t)$, for example when the normalized DPS voltage is below 0.01, the leaked RF switch drive signal is seen to fully dominate the RF output. In contrast, when the output stage 702 is configured for P-mode operation, leakage through the parasitic gate-drain leakage path 708 is seen to be substantially eliminated. Even when the normalized DPS voltage drops below 0.01, the RF output in P-mode can be reduced to less than −60 dBr, and the RF output follows the ideal square law very closely. The ability to essentially eliminate leakage and reduce the signal envelope of the RF output $RF_{OUT}$ to zero or near zero when the original AM dictates that it should be reduced to zero or near zero is attributable to the unique characteristics of P-mode operation.

In addition to essentially eliminating the leakage problem experienced in C-mode operation, any inability of C-mode operation to reduce the signal envelope of the RF output to zero or near zero that is caused by the DPS 606 being unable to reproduce low-magnitude events in its output voltage $V_{DD}(t)$ is also avoided by operating the output stage 702 of the RFPA 614 in P-mode. In C-mode operation, the RF output power can only be reduced by lowering the DPS supply voltage $V_{DD}(t)$. However, since P-mode operation has two degrees of freedom at controlling the RF output power produced by the RFPA 614, $V_{DD}(t)$ and $V_{GS}(t)$, and because the RF output power in P-mode is proportional to the product of these two variables, the signal envelope of the RF output of the RFPA 614 can be reduced to zero or near zero when it should despite any inability of the DPS 606 at reproducing low-magnitude events in its output voltage $V_{DD}(t)$.

It should be mentioned that since the Booth chart in FIG. 10 reveals that L-mode operation is also responsive to variations in the gate drive voltage $V_{GS}(t)$, it would be possible to use L-mode operation, instead of P-mode operation, to overcome the inability of C-mode operation to reduce the signal envelope of the RF output of the RFPA 614 to zero or near zero when the original AM dictates that it should. However, L-mode requires using a linear RFPA, which is highly inefficient compared to an RFPA operating in P-mode. Unlike in P-mode operation, where the RF output power of the RFPA 614 is proportional to the product $V_{DD}(t) \times V_{GS}(t)$ and can be reduced to very low levels by reducing both the gate drive voltage $V_{GS}(t)$ and the DPS voltage $V_{DD}(t)$, the RF output power of a linear RFPA is independent of its drain supply voltage. In fact, in a linear RFPA the drain supply voltage must at all times remain at a value high enough so that the linear RFPA can produce a linear reproduction of its RF input. Since the AM must be passed through the RF input of the linear RFPA, the RF output power must also be backed off in order to avoid signal peak clipping. These requirements result in low PA efficiency. Because of the poor efficiency that the linear PA provides in L-mode operation, P-mode operation is therefore preferred over L-mode operation as a means for overcoming the inability of C-mode operation to reduce the signal envelope of the RF output power to zero or near zero during times that the intended AM dictates that it should.

Figure 12:
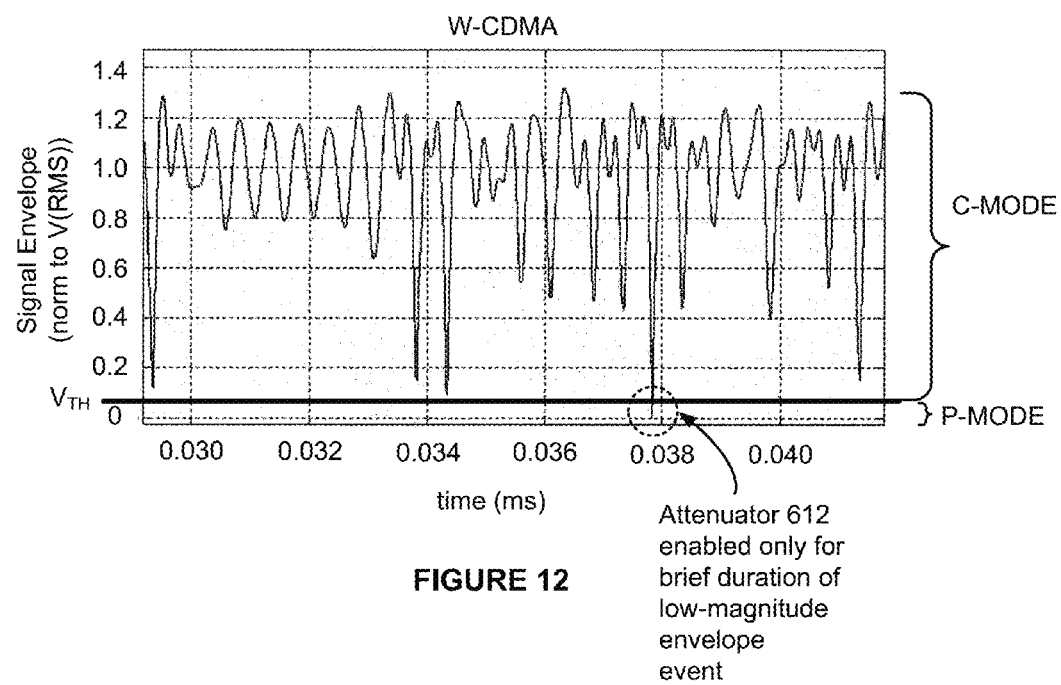
FIG. 12 is a waveform snippet of the signal envelope of a typical W-CDMA waveform, highlighting the times during which the output stage of the RFPA of the RF transmitter depicted in FIG. 6 is configured to operate in P-mode and in C-mode.

As alluded to above, in most circumstances the time that the output stage of the RFPA 614 operates in P-mode to address any particular low-magnitude event is short in duration. This short duration characteristic of low-magnitude events can be observed in FIG. 12, which is a waveform snippet of the signal envelope of a typical W-CDMA waveform. As can be seen in the waveform snippet, the duration of the encircled low-magnitude event is only on the order of a few microseconds or less. Once the low-magnitude event has passed through the RFPA 614, the attenuator 612 is disabled or rendered inactive and the output stage 702 of the RFPA 614 resumes operating in high-efficiency C-mode. It should be mentioned that although low-magnitude events are typically short in duration, it is possible, depending on the particular modulation scheme being used and/or RF output power requirements, that low-magnitude events endure for longer periods of time. Reproducing those extended-duration low-magnitude events at the RF output of the RFPA 614 is also possible using the methods and apparatuses of the present invention. Although operating the output stage 702 in P-mode for extended periods of time is less energy efficient than if C-mode could be used, the energy loss that results from operating the output stage 702 in P-mode is substantially less than the energy loss that would result if the output stage 702 was to be configured in L-mode.

Figure 13:
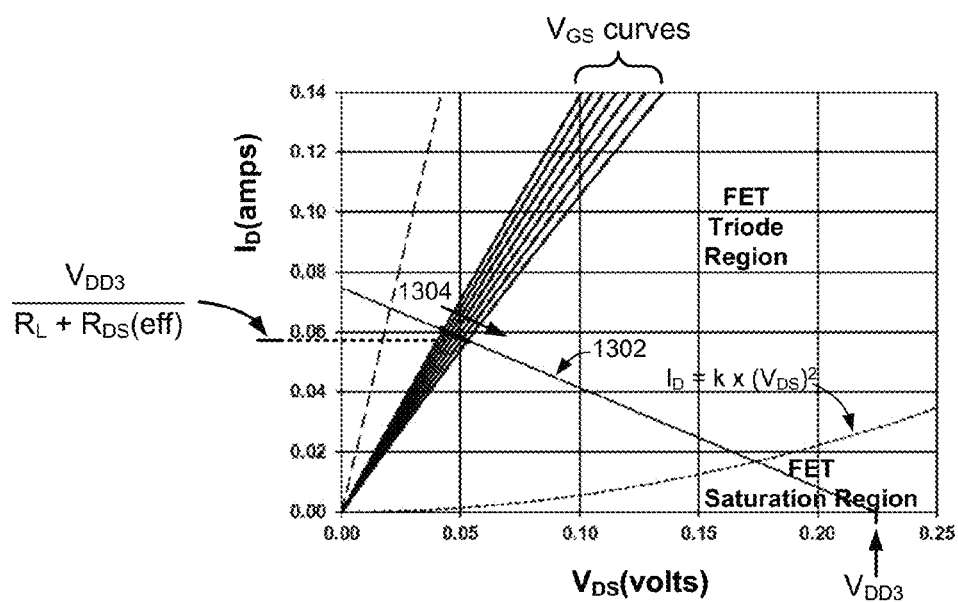
FIG. 13 a plot of the drain current $I_D$ versus drain-source voltage $V_{AS}$ characteristic curves of the output stage power transistor used in the output stage of the RFPA of the RF transmitter depicted in FIG. 6, focusing in on the region of the characteristic curves that is involved during P-mode operation.

To further illustrate P-mode operation, reference is made to FIG. 13, which is a plot of the drain current $I_D$ versus drain-source voltage $V_{DS}$ characteristic curves of the output stage 702 of the RFPA 614, focusing in on the region of the characteristic curves that is involved during P-mode operation. When operating in P-mode, the output stage 702 neither operates as a switch (as in C-mode) nor as a current source (as in L-mode). Rather, in P-mode the output stage power transistor 704 operates as controlled variable resistance (represented in FIG. 13 as an "effective" drain-source resistance $R_{DS}(\text{eff})$). Further, unlike in L-mode operation in which the output stage power transistor of the linear RFPA is biased and operates entirely within the saturation region, and unlike in C-mode in which the output stage 702 of the RFPA 614 is switched between the compressed area of the triode region and the cut-off region, the output stage 702 in P-mode operates entirely in the triode region or entirely in the deep triode region. The group of $V_{GS}$ curves and their intersection with the load line 1302 represent the available values of the low-magnitude RF drive voltage $V_{GS}(t)$ that can be applied to the output stage power transistor 704 when the output stage 702 is operating in P-mode during a particular low-magnitude event. Actually, as will be understood by those of ordinary skill the art, there is a continuum of $V_{GS}$ curves that are available but only several of them are shown in the group of $V_{GS}$ curves in the plot. Since P-mode is activated only when the DPS voltage $V_{DD}(t)$ is at a low-magnitude, it should be understood that the magnitude of $V_{DD3}$ is typically much lower than the DPS voltages $V_{DD1}$ and $V_{DD2}$ applied by the DPS 606 in the C-mode discussion above in reference to FIG. 8, i.e., $V_{DD3} \ll V_{DD2} < V_{DD1}$. (Compare FIG. 13 to FIG. 8.) The magnitude of the P-mode RF gate drive signal $V_{GS}(t)$ is reduced in accordance with the each successive $V_{GS}$ curve following the direction of the arrow 1304. Based on known leakage characteristics of the output stage 702 and/or the bandwidth handling characteristics of the DPS 606 (both of which can be measured and characterized during design) and based on the extent to which the low-envelope detector 620 determines that the low-magnitude event under consideration has fallen below the low-envelope threshold voltage $V_{TH}$, the low-envelope detector 620 directs the attenuator control signal generator 622 to generate and apply the appropriate attenuator control signal to the attenuator 612 necessary to attenuate the RF gate drive signal for P-mode operation and thereby allow the low-magnitude event contained in the original AM to be reproduced at the RF output of the RFPA 614. In some applications it may be sufficient to attenuate the RF gate drive signal by the same amount for each low-magnitude event that occurs, in which case the extent to which the RF gate drive signal $V_{GS}(t)$ attenuates all low-magnitude events will correspond to a single one of the $V_{GS}$ curves. In other applications it may be desirable to attenuate the RF gate drive signal more for one low-magnitude event and less for a another low-magnitude event, for example, in circumstances where one low-magnitude event in the original AM extends below the low-envelope threshold voltage $V_{TH}$ more than another, or, for example, in situations where the DPS 606 is more capable of reducing its output voltage $V_{DD}(t)$ for one low-magnitude occurrence than it is for another. In either circumstance, the attenuator control signal generator 622 would then be directed to provide a different attenuator control signal for the different low-magnitude events, and two or more of the $V_{GS}$ curves would correspond to two or more different attenuator control signals generated by the attenuator control signal generator 622. It should be mentioned that since the RF output power in P-mode is also dependent on the magnitude of the DPS voltage $V_{DD}(t)$, the RF output power can be further reduced, beyond that which may be possible by attenuating the RF gate drive signal $V_{GS}(t)$, by lowering the magnitude of the DPS voltage $V_{DD}(t)$ during a low-magnitude event, to the extent that the DPS voltage $V_{DD}(t)$ can be lowered, taking into consideration any bandwidth handling limitations the DPS 606 may have.

Figure 14:
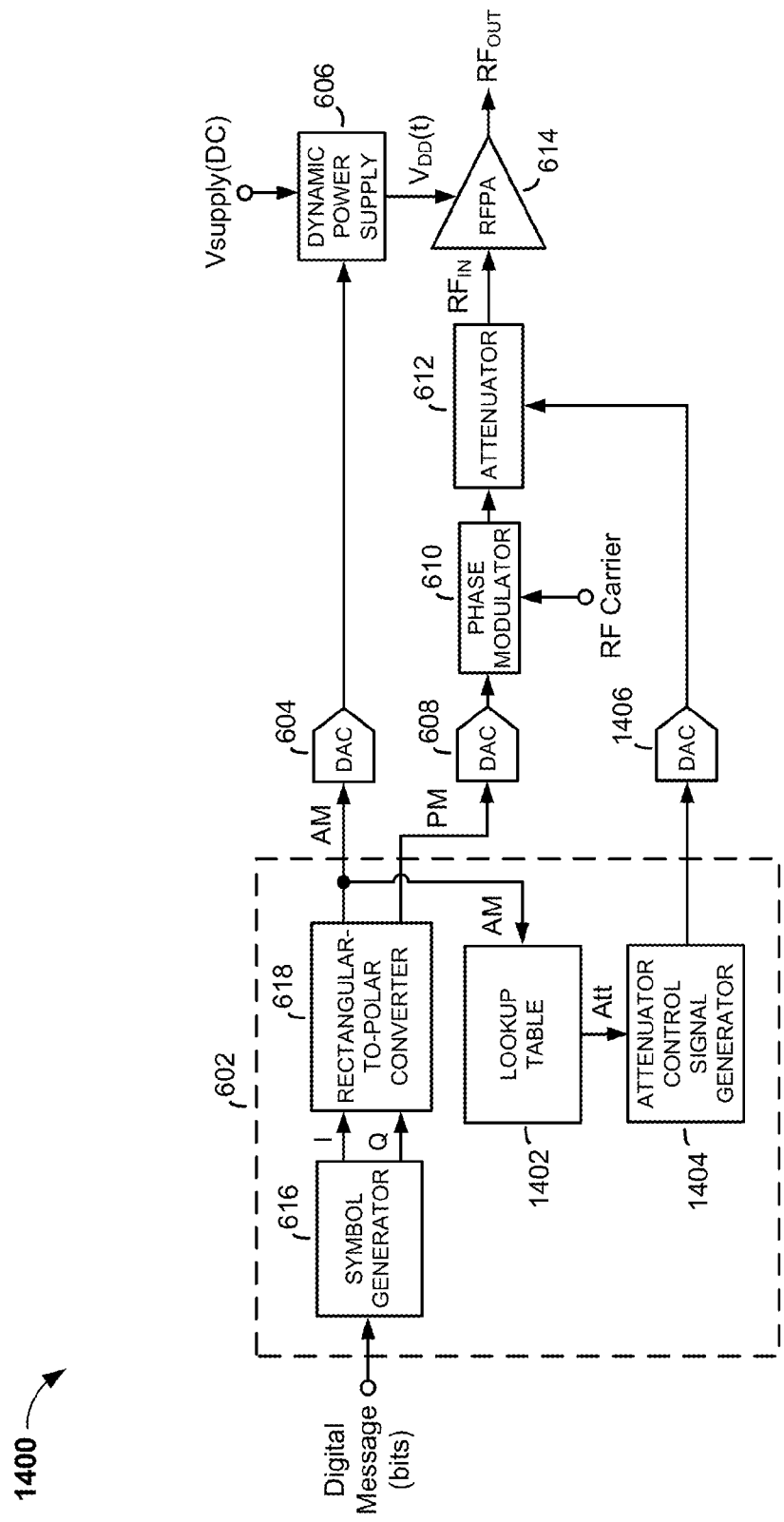
FIG. 14 is a drawing depicting an RF transmitter, according to another embodiment of the present invention.
Figure 15:
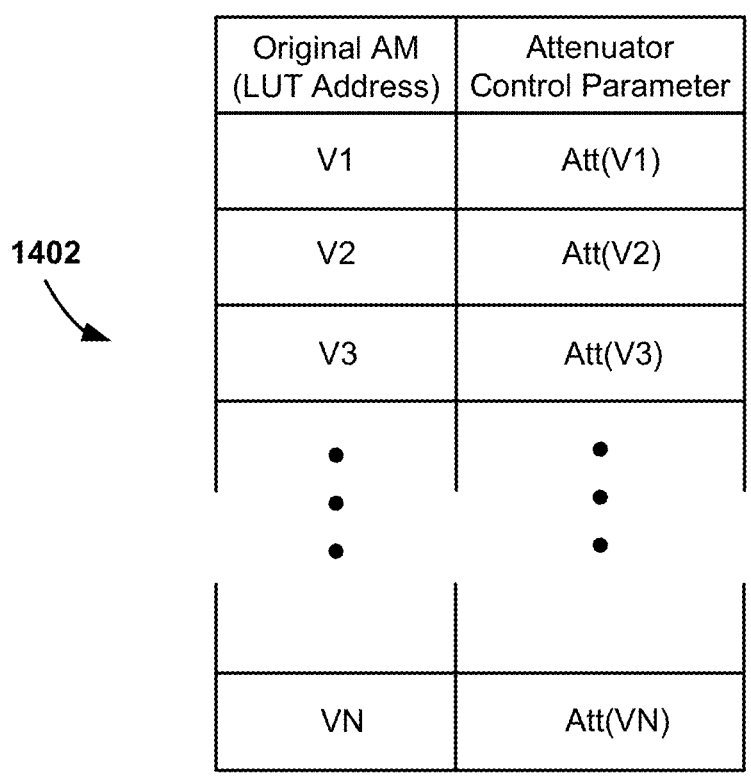
FIG. 15 is a conceptual drawing of the lookup table (LUT) used in the RF transmitter depicted in FIG. 14.

FIG. 14 is a drawing of an RF transmitter 1400, according to another embodiment of the present invention. Like the RF transmitter 600 described above, the RF transmitter 1400 overcomes the problems that prior art polar modulation transmitters have at reducing their RF output to zero or near zero when the original AM dictates that it should. However, rather than employing a low-envelope detector 602, a lookup table (LUT) 1402 is employed and the attenuator 612 is configured to vary its attenuation level over the duration of each low-magnitude event, thereby allowing low-magnitude events to not only be reproduced but also accurately tracked over their durations. As will be understood by those of ordinary skill in the art, the various entries of the LUT 1402 are stored in an electronic memory. The electronic memory may be either a volatile or nonvolatile memory, and may be either integrated in the same integrated circuit that makes up the other elements of the baseband processing unit 602 or may comprise an electronic memory device that is external to the baseband processing unit 602. FIG. 15 is a conceptual drawing of the LUT 1402 used in the RF transmitter 1400. As shown in the drawing, the LUT 1402 includes a plurality of attenuator control parameters Att(V1), Att(V2), . . . , Att(VN), each having a value that determines the level of attenuation that is applied by the attenuator 612 to the phase-modulated RF carrier and, consequently, the magnitude of the RF drive signal $V_{GS}(t)$ that is ultimately applied to the output stage 702 of the RFPA 614 during times low-magnitude events in the DPS voltage $V_{DD}(t)$ are being presented to the power supply port of the output stage 702. Similar to the RF transmitter 600 described in FIG. 6 above, the phase-modulated RF carrier is attenuated by the attenuator 612 to force the output stage 702 of the RFPA 614 to operate in P-mode, instead of C-mode, over the durations of the low-magnitude events. The attenuator control parameters Att(V1), Att(V2), . . . , Att(VN) stored in the LUT 1402 are indexed according to a plurality of digital addresses representing a plurality of different voltages V1, V2, . . . , VN that the original AM can have, and have values that depend on known leakage characteristic of the output stage 702 of the RFPA 614, known behavioral characteristics of the DPS 606 (e.g., any bandwidth handling constraints the DPS 606 may have that inhibit its ability to reduce its DPS voltage $V_{DD}(t)$ to zero or zero when the original AM dictates that it should), temporal characteristics of the particular modulation scheme being used, signal accuracy requirements specified in the objective communications standard, and/or possibly on other or similarly related factors. By providing a plurality of attenuator control parameters Att(V1), Att(V2), . . . , Att(VN) in the LUT 702 that depend on one or more of these factors, instead of just fixing the attenuation level of the attenuator 612 at a single attenuation level over the duration of each low-magnitude event, low-magnitude events in the original AM can be closely tracked over their entire durations and reproduced at the output of the RFPA 614, thus overcoming leakage problems through the output stage 702 of the RFPA 614 that prevent low-magnitude events in the original AM from being reproduced at the RF output of the RFPA 614 when operating in C-mode and despite any bandwidth handling limitation the DPS 606 may have that inhibits or prevents it from reproducing low-magnitude events in the DPS voltage $V_{DD}(t)$ it produces. During operation the baseband processing unit 602 directs digital samples of the original AM (each sample representing one of the voltage V1, V2, . . . , VN of the original AM) to address the LUT 1402, or directs some other digital signal that is dependent on or representative of the digital AM to address the LUT 1402. Depending on the digital value of each sample presented to the LUT 1402, a corresponding one of the attenuator control parameters Att(V1), Att(V2), . . . , Att(VN) is retrieved from the LUT 1402 and presented to the attenuator control signal generator 1404. The attenuator control signal generator 1404 responds to the retrieved attenuator control parameters Att(V) by varying the digital attenuator control signal applied to the control input of the attenuator 612 (after first being converted to an analog signal by a DAC 1406). Finally, responding to the AM-dependent attenuator control signal, the attenuator 612 attenuates the phase-modulated RF signal produced by the phase modulator 610, similar to as explained above, resulting in the magnitude of the RF drive signal $V_{GS}(t)$ that is being applied to the RF input of the output stage 702 of the RFPA 614 also being reduced to force the output stage 702 of the RFPA 614 to operate in P-mode. As a low-magnitude event traverses through the RFPA 614, different attenuator control parameter are retrieved from the LUT 1402, causing the attenuator 612 to vary its attenuation level accordingly. In this manner, each low-magnitude event in the original AM is tracked and reproduced at the RF output of the RFPA 614. It should be mentioned that, if necessary or desired, additional attenuator control parameters Att(V) for use in controlling the level of attenuation of the RF drive signal $V_{GS}(t)$ during C-mode operation can be included in the LUT 1402. Those additional C-mode entries will not affect the RF output power of the RFPA 614 (since in C-mode the RF output power is only sensitive to the magnitude of the dynamic power supply voltage $V_{DD}(t)$ and not to the magnitude of the RF drive signal $V_{GS}(t)$). However, they can be used to lower the magnitude of the RF drive signal $V_{GS}(t)$ as the AM in the DPS voltage $V_{DD}(t)$ is lowered toward an impending low-magnitude event. Including the additional C-mode entries in the LUT 1402 can thus help smooth the RF output power transition through the transition region 1002, i.e., between the C-mode and P-mode operating regions in the Booth chart. (See transition region 1002 in Booth chart in FIG. 10.) Further, attenuator control parameters Att(V) for use in controlling the level of attenuation of the RF drive signal $V_{GS}(t)$ when the output stage 702 is operating in the transition region 1002 can be also included in the LUT 1402, if desired or necessary. In the transition region 1002, the output stage 702 does not operate in C-mode and does not, strictly speaking, operate in pure P-mode. Rather, it operates in what may be referred to as "quasi P-mode." In quasi P-mode the RF output power of the RFPA 614 still depends on both the magnitude of the DPS voltage $V_{DD}(t)$ and the magnitude of the RF drive signal $V_{GS}(t)$. Including these additional quasi P-mode attenuator control parameters Att(V) in the LUT 1402 affords the ability to control the level of attenuation applied to the RF drive signal $V_{GS}(t)$ while the output stage 702 is operating through the transition region 1002 (i.e., for quasi P-mode operation) and can therefore be used to further facilitate a smooth power transition between C-mode and P-mode.

The RF transmitter 1400 depicted in FIG. 14 employs an analog attenuator 612. However, as will be appreciated and understood by those of ordinary skill in the art, a digital attenuator having a digital control input could be alternatively used, in which case the DAC 1406 would not be needed. If a digitally controlled attenuator is employed, the memory device storing the LUT 1402 could be designed with output drivers that are capable of directly driving the digital control input of the digitally controlled attenuator, in which case the separate attenuator control signal generator 1404 could also be eliminated.

Figure 16:
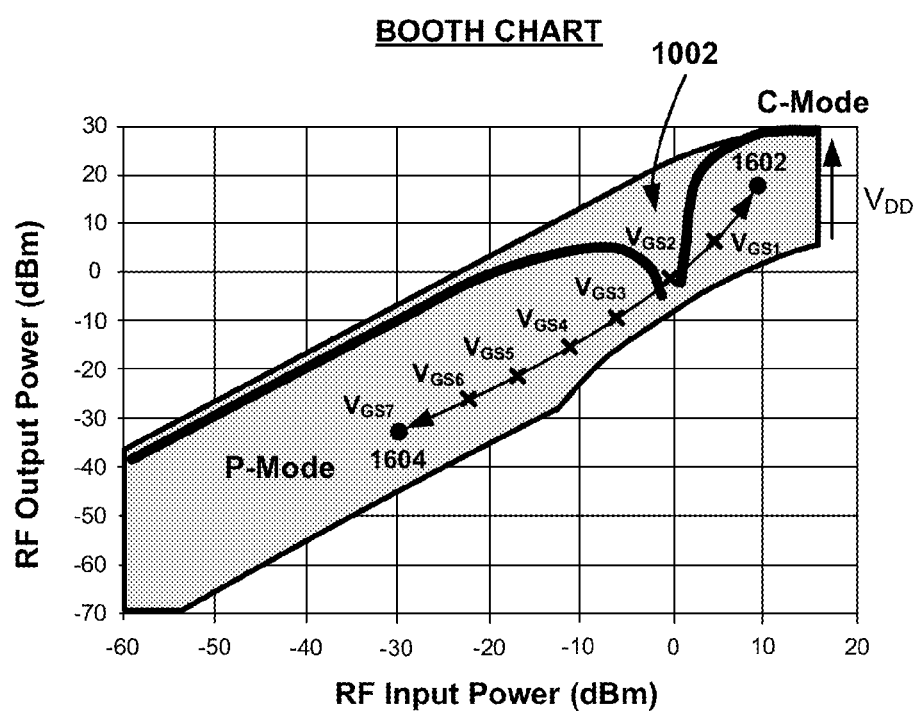
FIG. 16 is a reproduction of the Booth chart in FIG. 10, with various values of the RF drive signal $V_{GS}(t)$ that are applied to the output stage of the RFPA of the RF transmitter depicted in FIG. 14 superimposed on the chart.

FIG. 16 is a reproduction of the Booth chart originally presented in FIG. 10, with various values of the RF drive signal $V_{GS}(t)$ superimposed on the chart. The embellished Booth chart is presented here to further illustrate how the output stage 702 of the RFPA 614 of the RF transmitter 1400 is controlled during a transition from C-mode to P-mode and vice versa. As the original AM reduces in magnitude toward an impending low-magnitude event, the appropriate AM-dependent attenuator control parameters Att(V) that are needed to attenuate the phase-modulated RF carrier during times the low-magnitude event is presented to the power supply port of the output stage 702 are retrieved from the LUT 1402. As the low-magnitude event in the DPS voltage $V_{DD}(t)$ is presented to the power supply port of the output stage 702, the level of attenuation applied to the phase-modulated RF signal is gradually increased (by operation of the attenuator 612) according to each successive attenuator control parameter Att(V) retrieved from the LUT 1402. As illustrated in FIG. 16, this gradual attenuation of the phase-modulated RF signal results in the RF drive signal $V_{GS}(t)$ to the output stage 702 being gradually reduced in magnitude, from $V_{GS1}$ to $V_{GS2}$, from $V_{GS2}$ to $V_{GS3}$ and so on, until the minimum of the low-magnitude event is finally reached at the final P-mode operating point 1604 in the Booth chart. As the minimum of the low-magnitude event passes through the RFPA 614, the baseband processing unit 602 continues directing digital samples (addresses) to the LUT 1402 and as the original AM begins increasing in magnitude attenuator control parameters Att(V1), Att(V2), . . . , Att(VN) are retrieved from the LUT 1402 in a reverse order (not necessarily the same control parameters that were used in the transition from C-mode to P-mode), so that the level of attenuation applied to the phase-modulated RF signal by the attenuator 612 gradually decreases. Reducing the level of attenuation applied to the phase-modulated RF signal results in the magnitude of the resulting RF drive signal $V_{GS}(t)$ gradually increasing. Eventually, and as the low-magnitude event completes traversing through the output stage 702 of the RFPA 614, the RF drive signal $V_{GS}$ will have increased to a magnitude sufficient to force the output stage 702 to once again operate as a switch, i.e., to once again operate in C-mode.

Figure 17:
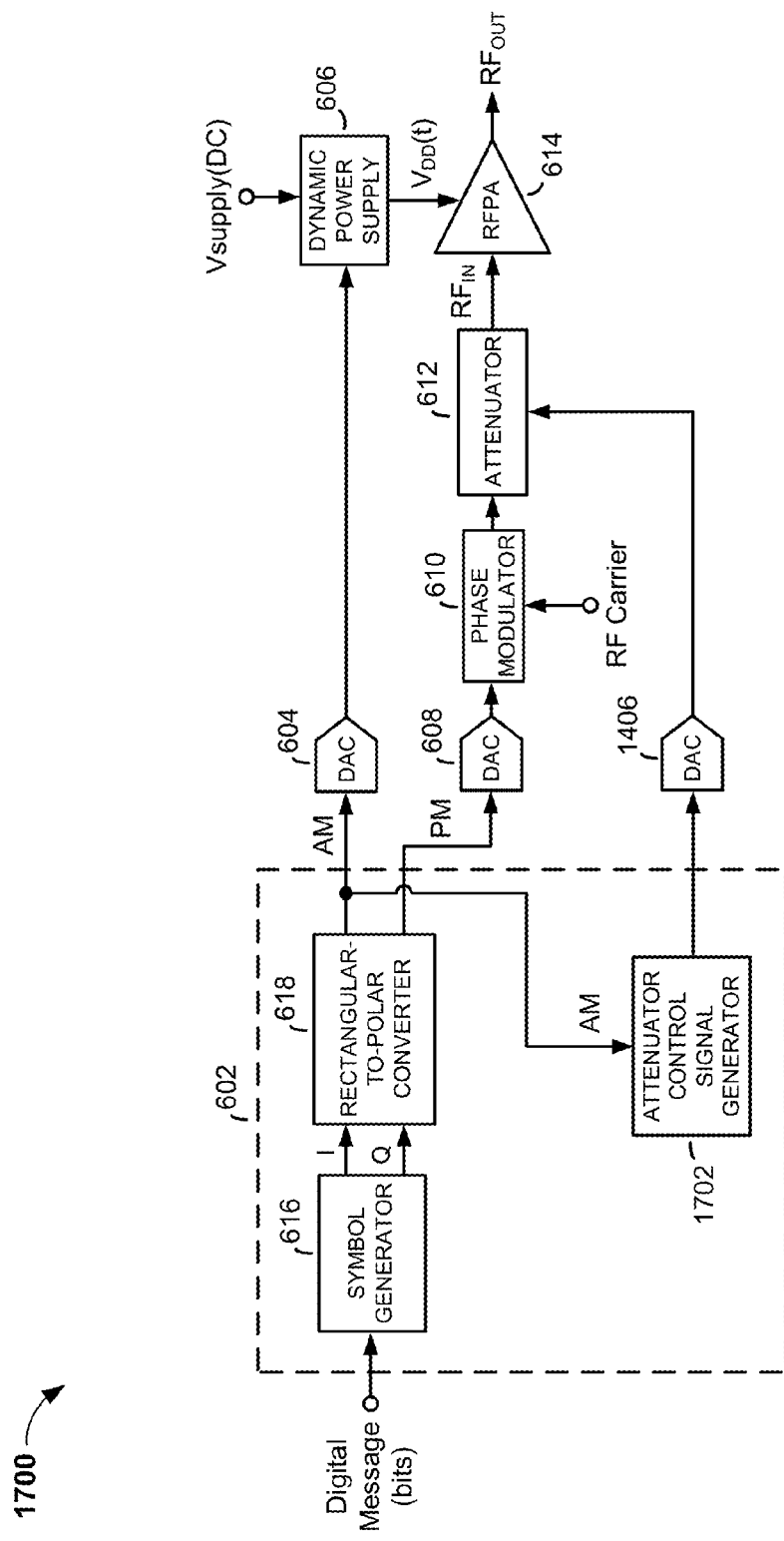
FIG. 17 is a drawing depicting an RF transmitter, according to another embodiment of the present invention.

FIG. 17 is a drawing depicting an RF transmitter 1700 according to another embodiment of the present invention. In this embodiment of the invention, rather than employing a low-envelope detector or a LUT to facilitate reproduction of low-magnitude events in the original AM at the RF output of the RFPA 614, the attenuator 612 in the RF transmitter 1700 is designed so that the level of attenuation it applies to the phase-modulated RF signal (output of the phase modulator 610) depends directly on the magnitude of the AM represented in the digital AM samples. The lower the magnitude the AM is the more the attenuator control signal generator 1702 directs the attenuator 612 to attenuate the phase-modulated RF signal. Accordingly, when the magnitude of the original AM is high, the phase-modulated RF signal is not attenuated (or is attenuated by only a small amount) and the resulting gate drive signal $V_{GS}$ applied to the output stage 702 remains high enough to serve as a switch drive signal that forces the output stage 702 of the RFPA 614 to operate as a switch (i.e., to operate in C-mode). As the magnitude of the original AM lowers toward a low-magnitude event, the attenuator control signal generator 1702 directs the attenuator 612 to increase the level of attenuation it applies to the phase-modulated RF signal, thereby lowering the magnitude of the gate drive signal $V_{GS}$ to the output stage 702 so that the output stage 702 naturally transitions from C-mode operation to P-mode operation during times low-magnitude events are presented to the power supply port of the output stage 702.

Figure 18:
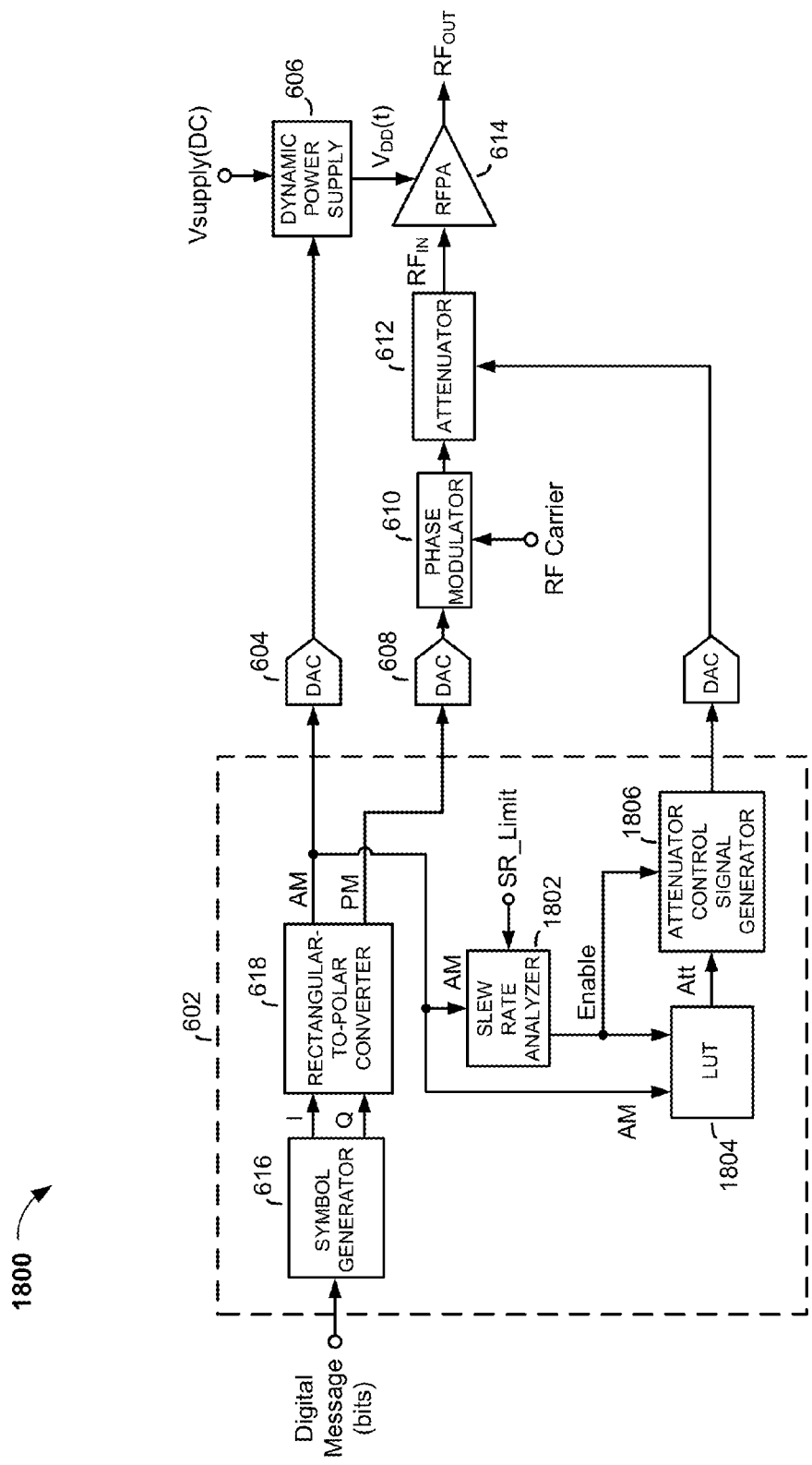
FIG. 18 is a drawing depicting an RF transmitter, according to another embodiment of the present invention.

FIG. 18 is a drawing depicting a radio frequency (RF) transmitter 1800, according to another embodiment of the present invention. According to this embodiment of the invention, the RF transmitter 1800 employs a slew rate analyzer 1802 to detect or determine low-magnitude events in the original AM. The slew rate analyzer 1802 operates based on the inventors' observation that the slew rate $\Delta V/\Delta t$ of the original AM generated by the baseband processing unit 602 is typically very high (i.e., fast) when a low-magnitude event in the original AM is about to occur. This characteristic of the original AM can be seen in the W-CDMA signal envelope waveform snippet in FIG. 12, where the slew rate of the AM is seen to be high when the encircled low-magnitude event is just about to occur and higher (steeper slope) than during other times in the AM. The slew rate analyzer 1802 exploits this characteristic in the original AM, using the high slew rate just prior to the occurrence of a low-magnitude as a precursor that is indicative of the impending low-magnitude event. More specifically, the slew rate analyzer 1802 detects or determines whether the slew rate of the incoming original AM exceeds some predetermined slew rate limit SR_limit, which is established during design, taking into consideration the behavioral characteristics and limitations of the DPS 606, temporal characteristics of the particular modulation scheme being used, signal accuracy requirements specified in the objective communications standard, and/or possibly on other or similarly related factors. Upon detecting or determining that the slew rate of the original AM has exceeded the slew rate limit SR_limit, the slew rate analyzer 1802 enables a LUT 1804 and associated attenuator signal generator 1806 to generate an AM-dependent attenuator control signal for the attenuator 612. Similar to the LUT 1402 used in the RF transmitter 1400 described above (see FIGS. 14 and 15), the LUT 1804 in the RF transmitter 1800 described here includes a plurality of attenuator control parameters Att(V1), Att(V2), . . . , Att(VN) that are indexed according to a plurality of digital addresses representing a plurality of different voltages V1, V2, . . . , VN that the original AM can have. In response to the attenuator control parameters that it receives, the attenuator control signal generator 1806 directs the attenuator 612 to attenuate the phase-modulated RF signal produced by the phase modulator 610, resulting in the RF drive signal that is being applied to the output stage 702 of the RFPA 614 to also reduce in magnitude and cause the output stage 702 of the RFPA 614 to operate in P-mode for the duration of time that a low-magnitude event is being presented to the power supply port of the output stage 702. Accordingly, once the LUT 1804 and attenuator control signal generator 1806 are enabled by the slew rate analyzer 1802, the process of tracking low-magnitude events in the original AM and resolving those low-magnitude events at the output of the RFPA 614 are performed in a manner similar to as described above.

The low-envelope detector 620, LUT 1402, and slew rate analyzer 1802 employed in the RF transmitters 600, 1400 and 1800 described above are illustrative of various exemplary approaches that can be used to detect or predict the onset of low-magnitude events in the original AM. Those of ordinary skill in the art will recognize and understand upon reading and with the benefit of this disclosure that other approaches might be employed without departing from the true spirit and scope of the invention. Therefore, unless the words of any particular claim appearing at the end of this disclosure unequivocally restricts the claim to any one of the various exemplary approaches discussed above, the claim should be construed to cover all approaches to detecting or predicting the onset of low-magnitude events in the original AM, including all of the exemplary approaches described above and all other possible approaches that fall within the true spirit and scope of the claimed invention.

Figure 19:
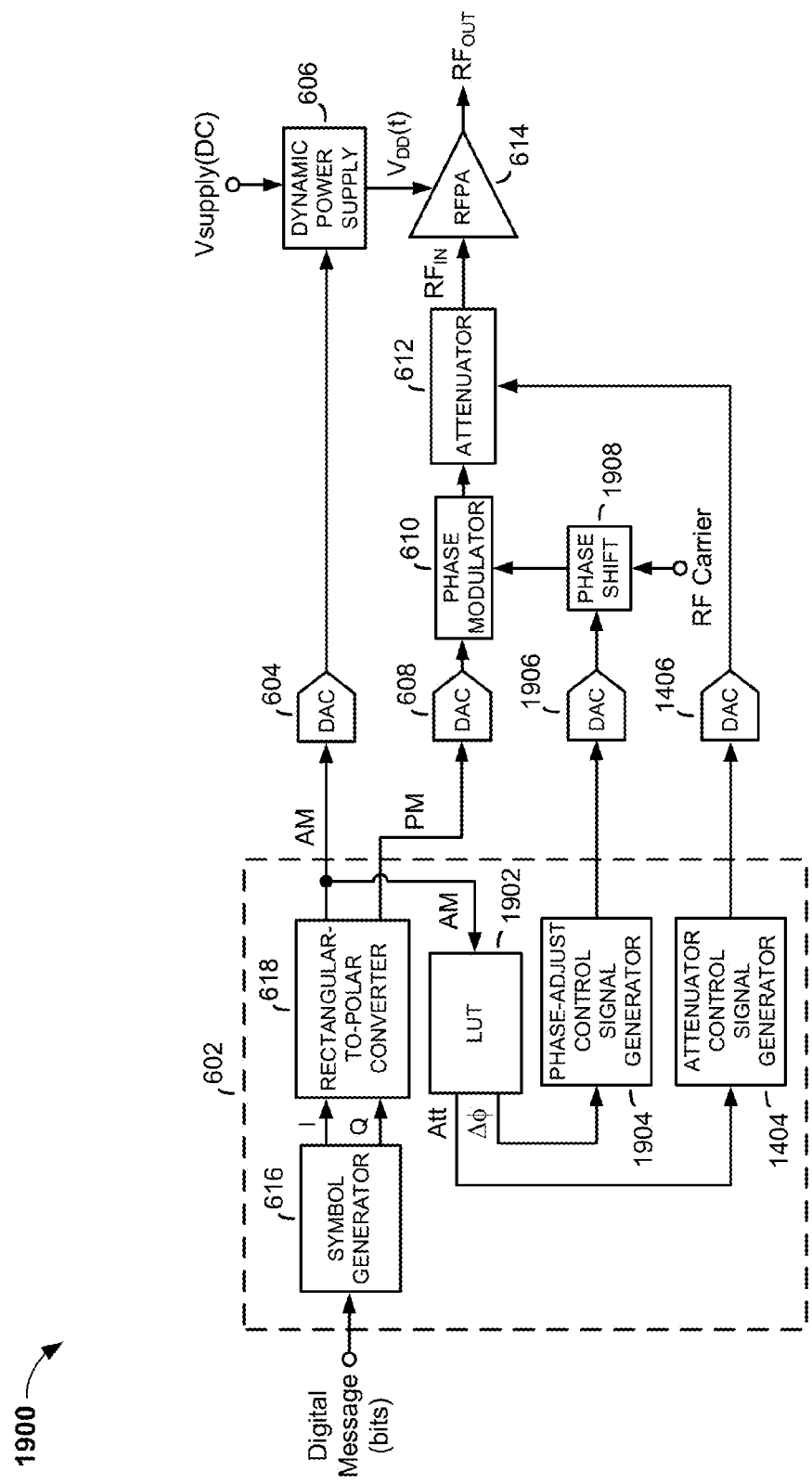
FIG. 19 is a drawing depicting an RF transmitter, according to another embodiment of the present invention.
Figure 20:
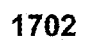
FIG. 20 is a conceptual drawing of a LUT used in the RF transmitter depicted in FIG. 19.

In some circumstances the phase of the RF output $RF_{OUT}$ of the RFPA 614 can vary from its intended phase (i.e., desired phase), due to changes in operating characteristics of the output stage power transistor 704 (see FIG. 7) that depend on the magnitude of the applied DPS voltage $V_{DD}(t)$. Deviation from the intended phase can also be impacted by the overall design of the RFPA 614. In some applications, the phase deviation may be unimportant. However, in applications where it is important, it is desirable to take measures to address it. Knowing that the phase of the RF output $RF_{OUT}$ depends on the magnitude of the DPS voltage $V_{DD}(t)$, and that the DPS voltage $V_{DD}(t)$ in turn depends on the magnitude of the original AM, in one embodiment of the invention the phase deviation is corrected by introducing an AM-dependent phase shift to the RF carrier before the RF carrier is introduced to the phase modulator 610 (or, alternatively, is introduced after the phase modulator 610 has modulated the RF carrier by the PM but before the phase-modulated RF is presented to the input of the RFPA 614). The amount of phase shift introduced depends on beforehand knowledge (e.g., as gained from measurements, modeling, or simulation data) of the phase deviation of the RF output from its intended phase as a function of drain voltage $V_{DD}(t)$. Using this beforehand knowledge, the appropriate amount of phase shift that needs to be introduced to the RF carrier in order to compensate for the AM-dependent phase deviation can be determined. FIG. 19 is a drawing depicting an RF transmitter 1900 that is equipped to perform this phase compensation process, in accordance with one embodiment of the invention. The RF transmitter 1900 is similar in construction to the RFPA 1400 shown and described above in reference to FIG. 14, except that it is equipped with a LUT 1902 that includes not only attenuator control parameters Att(V) that are used to attenuate the phase-modulated RF and thereby resolve low-magnitude events in the original AM at the RF output of the RFPA 614 but also includes phase-adjust control parameters Δϕ(V) that are used to correct for AM-dependent phase deviation in the RF output signal of the RFPA 614 from the intended or desired phase. FIG. 20 is a conceptual drawing of the LUT 1902 employed in the RF transmitter 1900. The LUT 1902 includes a plurality of attenuator control parameters Att(V1), Att(V2), . . . , Att(VN), each having an AM-dependent value that determines the level of attenuation applied to the phase-modulated RF carrier, and consequently, the magnitude of the RF drive signal $V_{GS}(t)$ that is ultimately applied to the output stage 702 of the RFPA 614 during times that a low-magnitude event in the DPS voltage $V_{DD}(t)$ is being applied to the power supply port of the output stage 702. Additionally, the LUT 1902 includes a plurality of phase-adjust control parameters Δϕ(V1), Δϕ(V2), . . . , Δϕ(VN), each having a value that also depends on the magnitude of the original AM. These phase-adjust control parameters Δϕ(V) can also include, if necessary or desired, phase-adjust control parameters that correct for any undesired phase deviation that might possibly occur when the output stage 702 of the RFPA 614 is operating in the transition region 1002 (see transition region 1002 in Booth chart in FIG. 16) and/or phase-adjust control parameters that can be used to correct for any phase deviation that results from transitioning between C-mode operation and P-mode operation. During operation the baseband processing unit 602 directs the digital AM samples to address the LUT 1902. Depending on the digital value of each AM sample presented to the LUT 1902, a corresponding pair of attenuator control and phase-adjust control parameters (Att(V), Δϕ(V)) is retrieved from the LUT 1902. Each attenuator control parameter Att(V) that is retrieved is presented to the attenuator control signal generator 1404, which generates the appropriate attenuation level for the attenuator 612, similar to as described above. Additionally, each phase-adjust control parameter Δϕ(V) retrieved from the LUT 1902 is presented to a phase-adjust control signal generator 1904, which is applied to the control input of a phase shifter 1908 (after first being converted to analog by DAC 1906). The phase shifter 1908 shifts the phase of the RF carrier according to the AM-dependent phase-adjust control signal provided by the phase-adjust control signal generator, thereby compensating for AM-dependent phase deviation at the RF output of the RFPA 614. It should be mentioned that whereas the phase modulator 610 in FIG. 19 comprises an analog phase modulator, a digital phase modulator having a digital control input could be alternatively used, in which case the phase shifter 1908 could also be digitally implemented. It should also be mentioned that in the case of a digitally controlled phase modulator and digital phase shifter 1908, the memory device storing the LUT 1902 could be designed with output drivers that are configured to directly drive the digital phase shifter 1908, in which case there would be no need for the separate phase-adjust control signal generator 1904. Similarly, the attenuator 612 could alternatively comprise a digitally controlled attenuator, in which case the LUT 1902 could be designed with output drivers that are capable of directly driving the digital control input of the digitally controlled attenuator, thus obviating the need for the separate attenuator control signal generator 1404.

Figure 21:
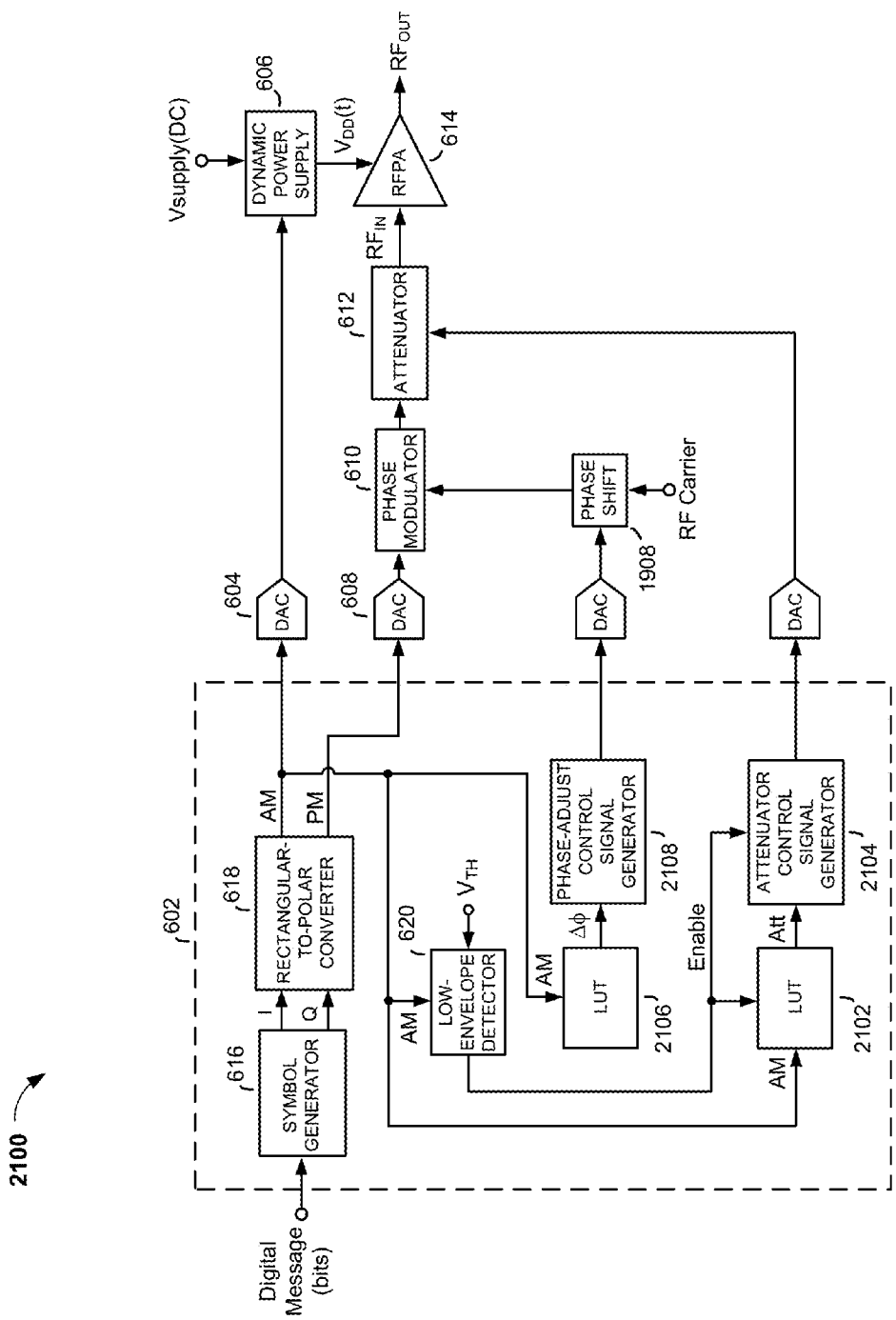
FIG. 21 is a drawing depicting an RF transmitter, according to another embodiment of the present invention.

FIG. 21 is a drawing depicting an RF transmitter 2100 in accordance with another embodiment of the present invention. This embodiment of the invention employs a low-envelope detector 620, similar to the RF transmitter 600 depicted in FIG. 6 does, but utilizes the low-envelope detector to enable a first LUT 2102 and associated attenuator control signal generator 2104 during times the output stage 702 of the RFPA 614 is to operate in P-mode. The first LUT 1904 includes a plurality of attenuator control parameters Att(V1), Att(V2), . . . , Att(VN), indexed according to a plurality of digital addresses representing a plurality of different voltages V1, V2, . . . , VN that the original AM can have when the magnitude of the AM is below the low-envelope threshold $V_{TH}$. Accordingly, when a low-magnitude event in the DPS voltage $V_{DD}(t)$ is being presented to the power supply port of the output stage 702 and the first LUT 2102 and attenuator control signal generator 2104 are enabled, the appropriate AM-dependent attenuator control parameters are retrieved from the first LUT 2102 and applied to the attenuator control signal generator 2104, which responds by directing the attenuator 612 to apply the appropriate attenuation level to the phase-modulated RF signal produced by the phase modulator 610. Similar to as explained, above, reducing the magnitude of the phase-modulated RF signal results in the magnitude of the RF drive signal to the output stage 702 of RFPA 614 also being reduced in magnitude, thereby ensuring that the output stage 702 operates in P-mode for the duration of time that the low-magnitude event in the DPS voltage $V_{DD}(t)$ is being presented to the power supply port of the output stage 702 and allowing low-magnitude events in the original AM to be tracked and reproduced at the RF output of the RFPA 614. The RF transmitter 2100 may further include a second LUT 2106 and associated phase-adjust control signal generator 2108. The second LUT 2106 includes a plurality of phase-adjust control parameters Δϕ(V1), Δϕ(VN), each having a value that depends on the magnitude of the original AM, similar to the phase-adjust control parameters Δϕ(V1), Δϕ(VN) used in the LUT 1902 of the RF transmitter 1900 described above in reference to FIG. 19. Together, and depending on the magnitude of the AM represented by the digital AM samples it receives, the second LUT 2106 and phase-adjust control signal generator 2108 serve to control the amount of phase shift that the phase shifter 1908 introduces to the RF carrier before being applied to the phase modulator 610, thereby allowing AM-dependent phase deviation of the RF output of the RFPA 614 to be corrected.

Figure 22:
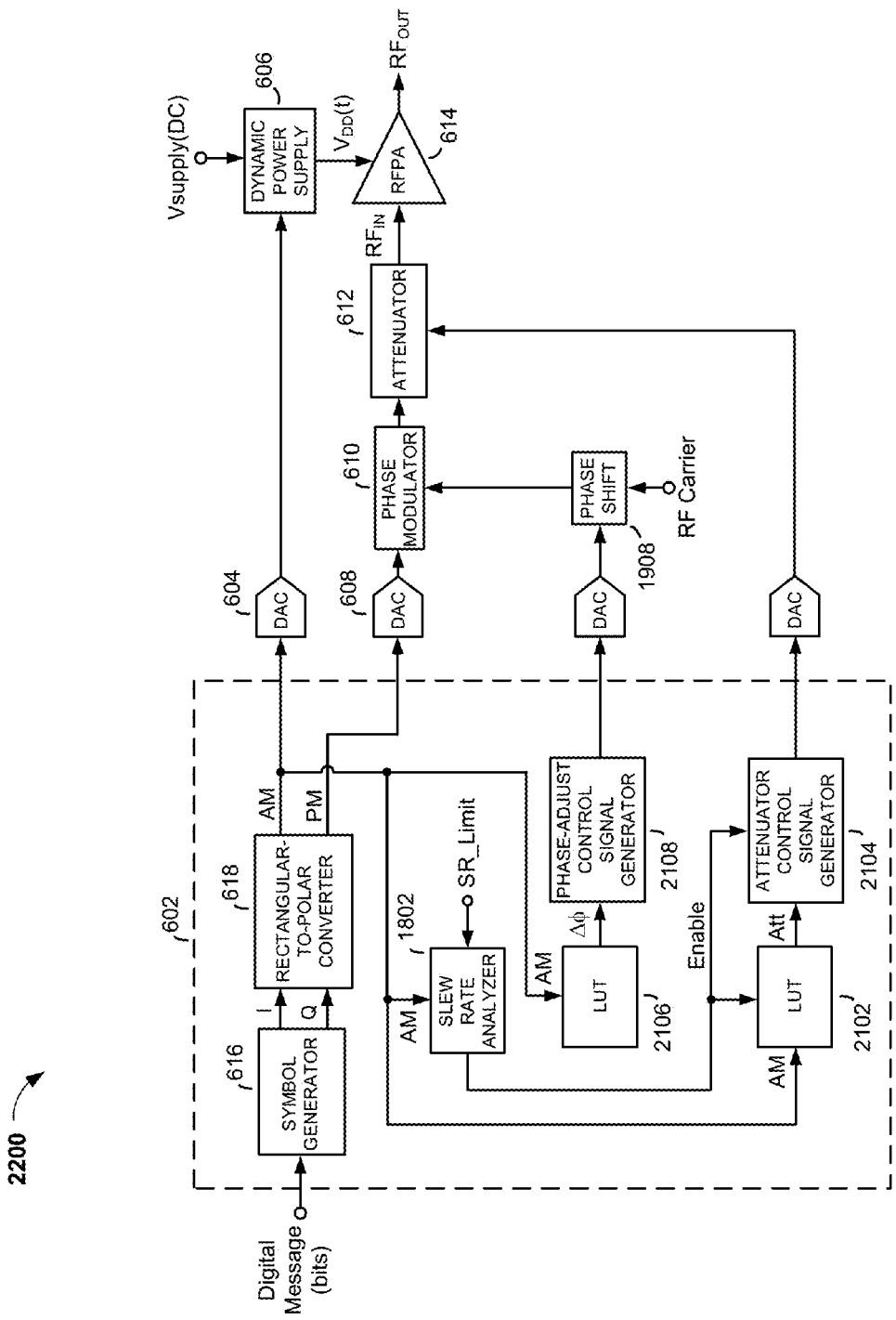
FIG. 22 is a drawing depicting an RF transmitter, according to another embodiment of the present invention.

FIG. 22 is a drawing depicting a radio frequency (RF) transmitter 2200, according to another embodiment of the present invention. The RF transmitter 2200 is similar in construction to the RF transmitter 2100 described above in reference to FIG. 21, except that it employs a slew rate analyzer 1802 to enable the first LUT 2102 and associated attenuator control signal generator 2104 during times the output stage 702 of the RFPA 614 is to operate in P-mode, rather than employing the low-envelope detector 620. The RF transmitter 2200 also operates similar to the RF transmitter 2100 described above except that the first LUT 2102 and associated attenuator control signal generator 2104 are enabled and P-mode operation of the output stage 702 is initiated upon the slew rate analyzer 1802 determining that the original AM has exceeded a slew rate limit SR_limit, instead of being initiated based on the low-envelope detector 620 determining that the magnitude of the original AM has fallen below some low-envelope threshold $V_{TH}$.

While various embodiments of the present invention have been presented, they have been presented by way of example and not limitation. It will be apparent to persons skilled in the relevant art that various changes in form and detail may be made to the exemplary embodiments without departing from the true spirit and scope of the invention. Accordingly, the scope of the invention should not be limited by the specifics of the exemplary embodiments of the invention but, instead, should be determined by the appended claims, including the full scope of equivalents to which such claims are entitled.

What is claimed is:

1. A method of reproducing low-magnitude events contained in an input amplitude modulation (AM) signal at an output of a radio frequency power amplifier (RFPA), comprising:
   generating a dynamic power supply (DPS) voltage from an input AM signal;
   applying the DPS voltage to a power supply port of an RFPA;
   configuring the RFPA to operate in a compressed mode (C-mode);
   upon an instantaneous magnitude of the DPS voltage traversing below a low-magnitude limit, configuring the RFPA to operate in a product mode (P-mode); and
   upon the DPS voltage reversing trajectory and the instantaneous magnitude of the DPS voltage subsequently traversing above the low-magnitude limit, reconfiguring the RFPA to operate in the C-mode.

2. The method of claim 1, further comprising analyzing the input AM to determine when the instantaneous magnitude of the DPS voltage will traverse below the low-magnitude limit.

3. The method of claim 1, wherein analyzing the input AM comprises comparing the instantaneous magnitude of the input AM to a low-envelope threshold.

4. The method of claim 1, wherein configuring the RFPA to operate in the P-mode comprises attenuating an input RF signal applied to an RF input of the RFPA.

5. The method of claim 4, wherein attenuating the input RF signal comprises applying the input AM or a signal representative of the input AM to an attenuator control input of an attenuator disposed in an input RF path of the RFPA.

6. The method of claim 4, wherein attenuating the input RF signal comprises:
   retrieving AM-dependent attenuator control parameters from a lookup table (LUT) containing a plurality of AM-dependent attenuator control parameters; and
   attenuating the input RF signal according to the retrieved AM-dependent attenuator control parameters.

7. The method of claim 1, further comprising:
   retrieving AM-dependent phase-adjust control parameters from a lookup table (LUT) containing a plurality of AM-dependent phase-adjust control parameters; and
   adjusting a phase of the input RF signal according to the retrieved AM-dependent phase-adjust control parameters to compensate for AM-dependent phase distortion caused by the RFPA.

8. The method of claim 1, further comprising:
   determining a slew rate of the input AM; and
   configuring the RFPA to operate in the P-mode if the slew rate exceeds a bandwidth handling capability of a DPS used in generating the DPS voltage.

9. A radio frequency (RF) transmitter, comprising:
   a baseband processing unit configured to generate an amplitude modulation (AM) signal;
   a dynamic power supply (DPS) configured to generate a DPS voltage using the AM signal;
   an RF power amplifier (RFPA) having an output stage with a power supply port configured to receive the DPS voltage,
   wherein the RFPA is configured to operate in a compressed mode (C-mode) most of the time but is reconfigured to operate in a product mode (P-mode) upon an instantaneous magnitude of the DPS voltage traversing below a low-magnitude limit.

10. The RF transmitter of claim 9, wherein the baseband processing unit is configured to analyze or monitor an instantaneous magnitude of an AM signal to determine or predict when the instantaneous magnitude of the DPS voltage will traverse below the low-magnitude limit.

11. The RF transmitter of claim 9, wherein the baseband processing unit is configured to analyze or monitor digital samples representing the instantaneous magnitude of the AM signal to determine or predict when the instantaneous magnitude of the DPS voltage will traverse below the low-magnitude limit.

12. The RF transmitter of claim 9, further comprising an attenuator that is disposed in an input RF path of the RFPA and that is configured to attenuate an input RF signal to the RFPA depending on an instantaneous magnitude of the AM signal.

13. The RF transmitter of claim 12, further comprising an electronic memory configured to store a lookup table (LUT) that contains a plurality of attenuator control parameters having values that depend on the instantaneous magnitude of the AM signal and that are used to control an attenuation level provided by the attenuator.

14. The RF transmitter of claim 13, wherein the electronic memory is further configured to store a LUT that contains a plurality of phase-adjust control parameters that depend on the instantaneous magnitude of the AM signal and that are used to adjust a phase of an RF signal applied to an RF input of the RFPA in order to compensate for AM-dependent phase distortion caused by the RFPA.

15. The RF transmitter of claim 9, wherein the baseband processing unit is configured to measure or calculate a slew rate of the AM signal and the RFPA is configured to operate in P-mode if the measured or calculated slew rate exceeds a bandwidth handling capability of the DPS.

* * * * *